(12) United States Patent
Liaw

(10) Patent No.: US 11,587,872 B2
(45) Date of Patent: Feb. 21, 2023

(54) INTERCONNECT STRUCTURE FOR IMPROVING MEMORY PERFORMANCE AND/OR LOGIC PERFORMANCE

(71) Applicant: Taiwan Semiconductor Manufacturing Company, Ltd., Hsin-Chu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 4 days.

(21) Appl. No.: 17/343,335

(22) Filed: Jun. 9, 2021

(65) Prior Publication Data
US 2022/0262730 A1 Aug. 18, 2022

Related U.S. Application Data

(60) Provisional application No. 63/148,863, filed on Feb. 12, 2021.

(51) Int. Cl.
*H01L 23/528* (2006.01)
*H01L 27/11* (2006.01)
(Continued)

(52) U.S. Cl.
CPC ............ *H01L 23/5283* (2013.01); *G11C 5/06* (2013.01); *G11C 5/063* (2013.01);
(Continued)

(58) Field of Classification Search
CPC ......... H01L 23/5283; H01L 21/823871; H01L 27/1108; H01L 27/1116; H01L 29/0665;
(Continued)

(56) References Cited

U.S. PATENT DOCUMENTS 7,259,979 B2   8/2007   Sachan et al.
8,947,902 B2   2/2015   Liaw
(Continued)

FOREIGN PATENT DOCUMENTS

KR   20130110816 A   10/2013
KR   20180127288 A   11/2018

*Primary Examiner* — Tri M Hoang
(74) *Attorney, Agent, or Firm* — Haynes and Boone, LLP

(57) ABSTRACT

Configurations of metal layers of interconnect structures are disclosed herein that can improve memory performance, such as static random-access memory (SRAM) memory performance, and/or logic performance. For example, embodiments herein place bit lines in a metal one (M1) layer, which is a lowest metallization level of an interconnect structure of a memory cell, to minimize bit line capacitance, and configure bit lines as the widest metal lines of the metal one layer to minimize bit line resistance. In some embodiments, the interconnect structure has a double word line structure to reduce word line resistance. In some embodiments, the interconnect structure has a double voltage line structure to reduce voltage line resistance. In some embodiments, jogs are added to a word line and/or a voltage line to reduce its respective resistance. In some embodiments, via shapes of the interconnect structure are configured to reduce resistance of the interconnect structure.

20 Claims, 23 Drawing Sheets

(51) Int. Cl.
  *H01L 29/423* (2006.01)
  *H01L 29/06* (2006.01)
  *H01L 29/786* (2006.01)
  *H01L 21/8238* (2006.01)
  *G11C 5/06* (2006.01)

(52) U.S. Cl.
  CPC .. *H01L 21/823871* (2013.01); *H01L 27/1108* (2013.01); *H01L 27/1116* (2013.01); *H01L 29/0665* (2013.01); *H01L 29/42392* (2013.01); *H01L 29/78696* (2013.01)

(58) Field of Classification Search
  CPC ......... H01L 29/42392; H01L 29/78696; G11C 5/06; G11C 5/063
  See application file for complete search history.

(56) References Cited

U.S. PATENT DOCUMENTS

| | | | |
|---|---|---|---|
| 8,964,455 B2* | 2/2015 | Liaw | H01L 29/785 365/49.1 |
| 8,976,573 B2* | 3/2015 | Liaw | G11C 8/14 365/154 |
| 9,349,436 B2 | 5/2016 | Liaw | |
| 9,564,211 B2* | 2/2017 | Liaw | G11C 11/419 |
| 9,576,644 B2* | 2/2017 | Liaw | H01L 23/5226 |
| 9,583,438 B2 | 2/2017 | Liaw et al. | |
| 9,659,635 B1* | 5/2017 | Liaw | H01L 28/00 |
| 9,672,903 B2* | 6/2017 | Liaw | G11C 5/063 |
| 9,704,564 B2* | 7/2017 | Liaw | H01L 27/0207 |
| 9,721,645 B1* | 8/2017 | Liaw | G11C 11/413 |
| 9,865,542 B2 | 1/2018 | Liaw et al. | |
| 9,935,001 B2 | 4/2018 | Liaw | |
| 9,990,986 B1 | 6/2018 | Park et al. | |
| 10,153,264 B2* | 12/2018 | Hirose | H01L 27/1116 |
| 10,381,070 B2* | 8/2019 | Liaw | G11C 11/412 |
| 10,461,086 B2 | 10/2019 | Liaw | |
| 10,720,436 B2* | 7/2020 | Chen | H01L 27/1116 |
| 2007/0230251 A1 | 10/2007 | Ajika et al. | |
| 2010/0289111 A1 | 11/2010 | Lee et al. | |
| 2019/0354653 A1 | 11/2019 | Weng et al. | |
| 2020/0251476 A1* | 8/2020 | Chang | H01L 23/535 |
| 2020/0335585 A1* | 10/2020 | Liaw | H01L 27/0928 |

* cited by examiner

US 11,587,872 B2

1

INTERCONNECT STRUCTURE FOR IMPROVING MEMORY PERFORMANCE AND/OR LOGIC PERFORMANCE

This is a non-provisional application of and claims benefit of U.S. Provisional Patent Application Ser. No. 63/148,863, filed Feb. 12, 2021, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, interconnects of the MLI features are exhibiting increased resistance and exhibiting increased capacitance, which presents performance, yield, and cost challenges. It has been observed that these higher resistances and/or higher capacitances exhibited by interconnects in advanced IC technology nodes can significantly delay (and, in some situations, prevent) signals from being routed efficiently to and from IC devices, such as transistors, negating any improvements in performance of such IC devices in the advanced technology nodes. Performance of advanced memories, such as static random-access memory ("SRAM"), is especially sensitive to these delays, where the advanced memories are requiring ever faster speeds (e.g., fast write/read). Accordingly, although existing MLI features for memory-based ICs and their interconnects have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

2

Figure 5A:
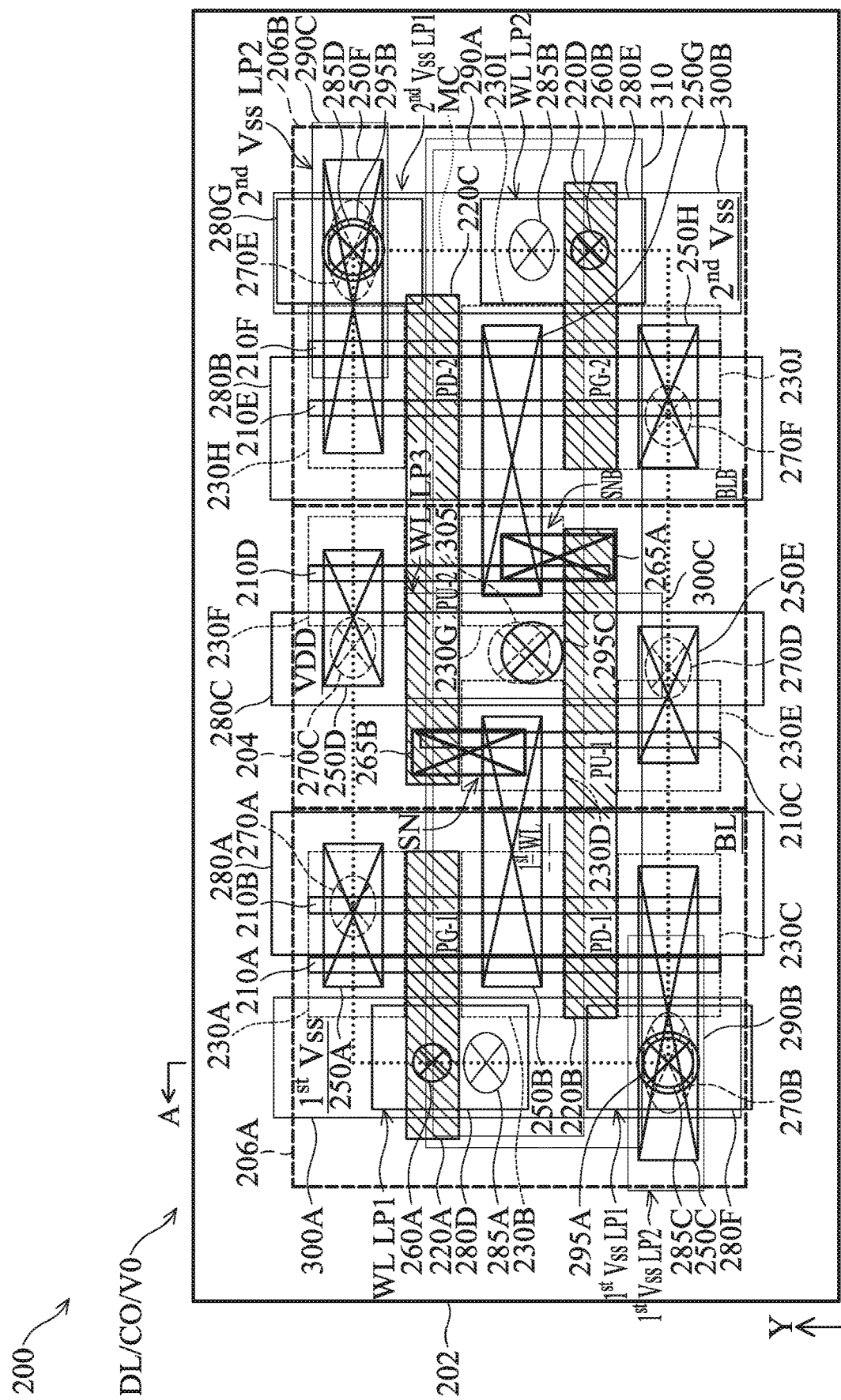
Figure 5B:
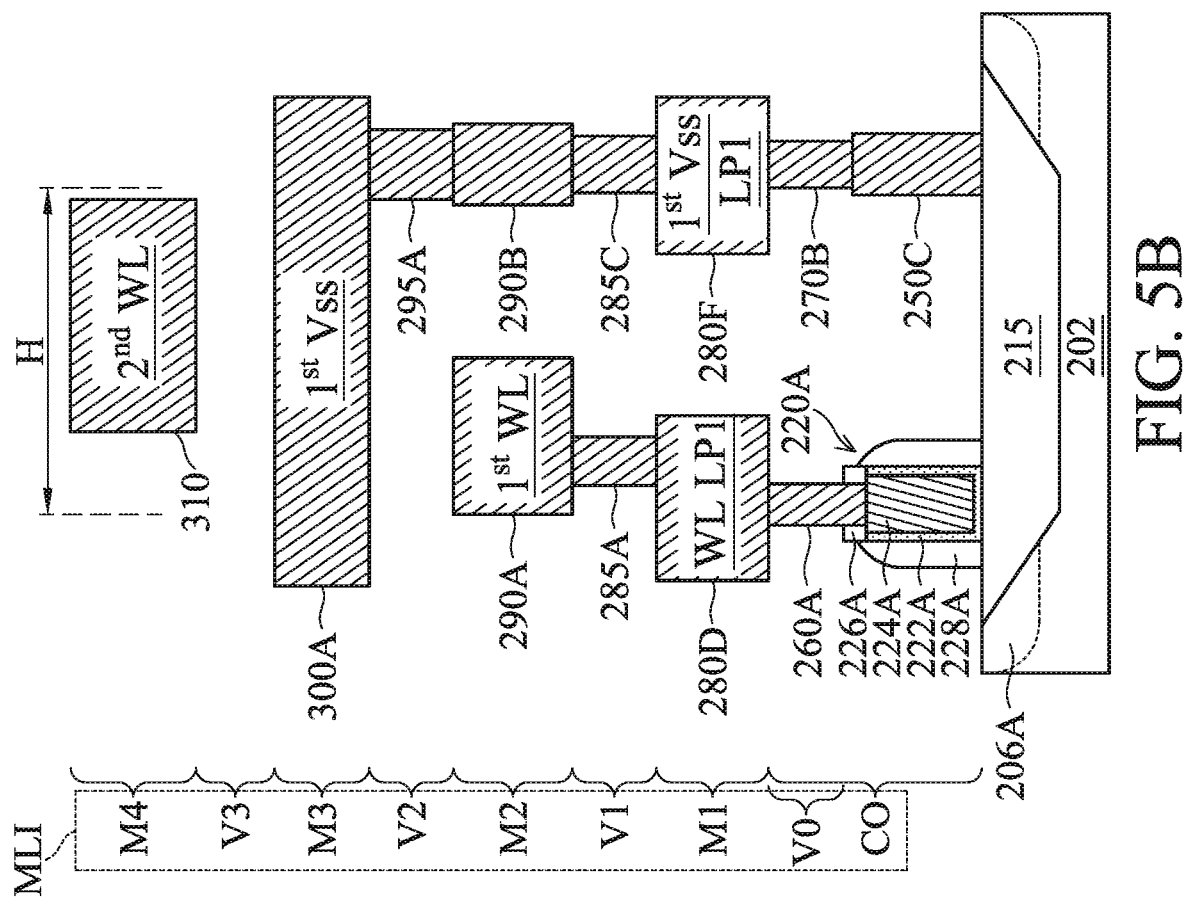

FIG. 5A and FIG. 5B are fragmentary diagrammatic views of a memory cell, such as an SRAM cell, in portion or entirety, according to various aspects of the present disclosure.

FIG. 6A, FIG. 6B, FIG. 6C, FIG. 6D, and FIG. 6E are various top, plan views of various layers of the memory cell of FIG. 5A and FIG. 5B, in portion or entirety, according to various aspects of the present disclosure.

Figure 7:
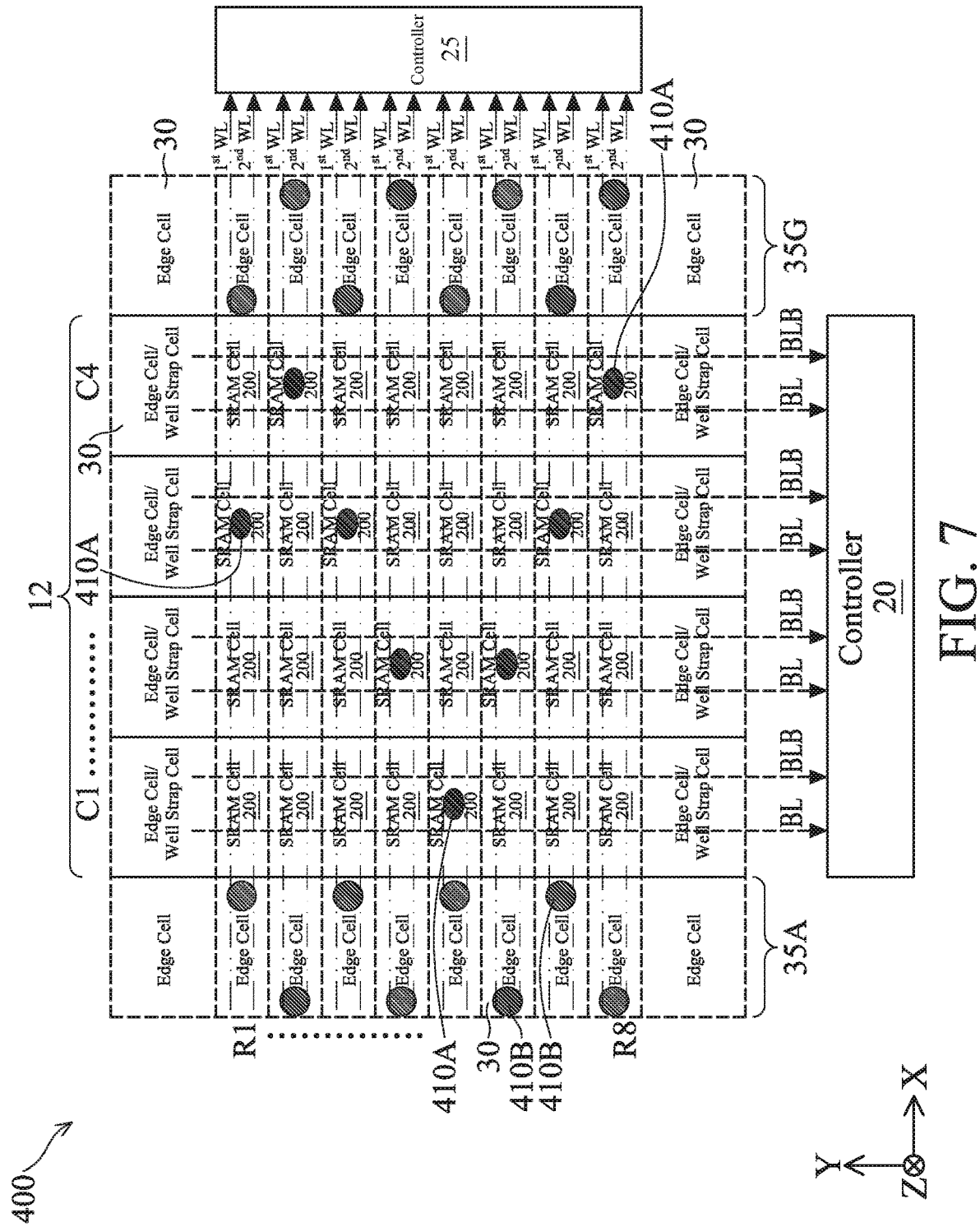

FIG. 7 is a fragmentary diagrammatic plan view of a memory having a double word line structure, in portion or entirety, according to various aspects of the present disclosure.

Figure 8A:
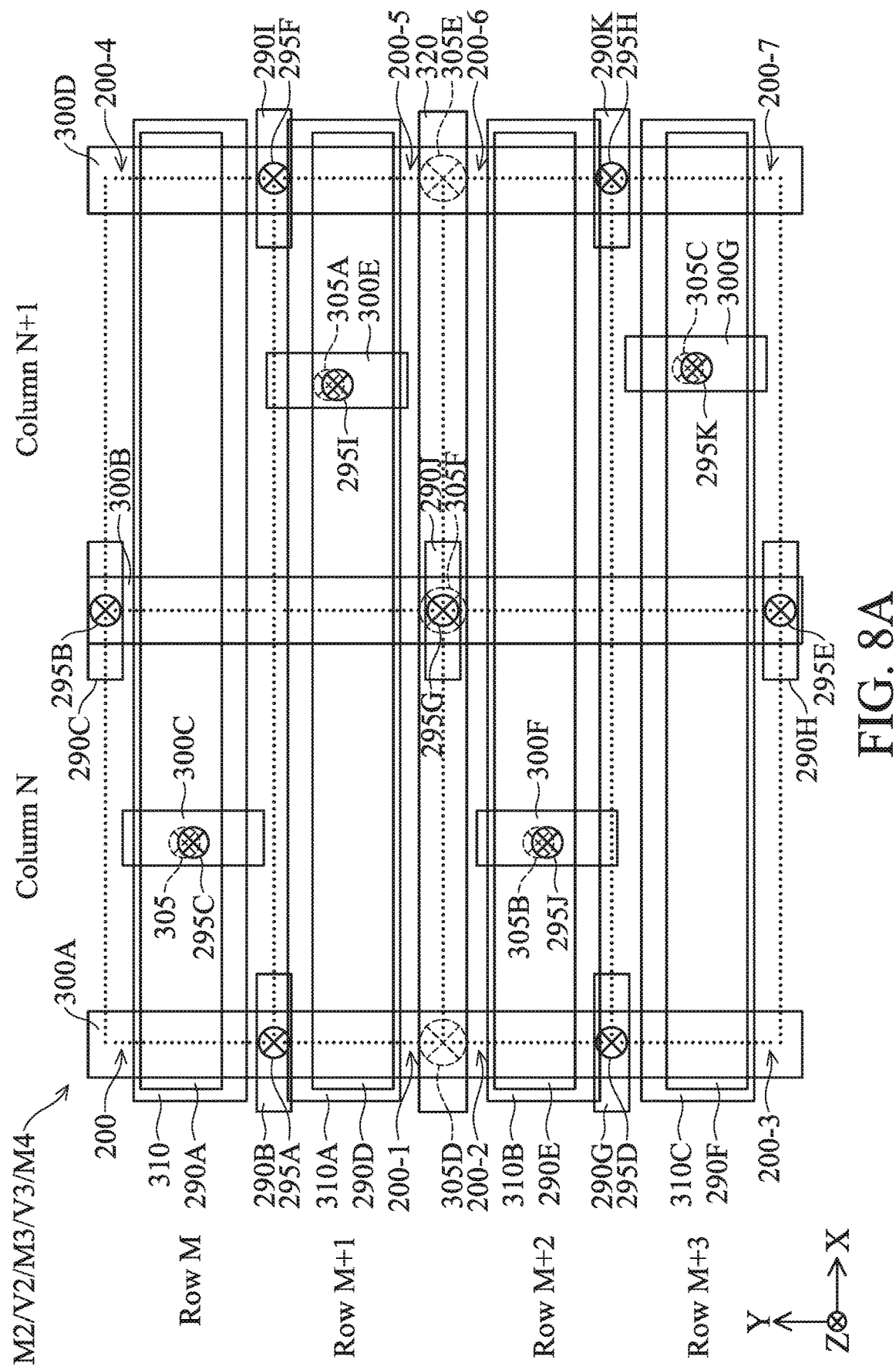
Figure 8B:
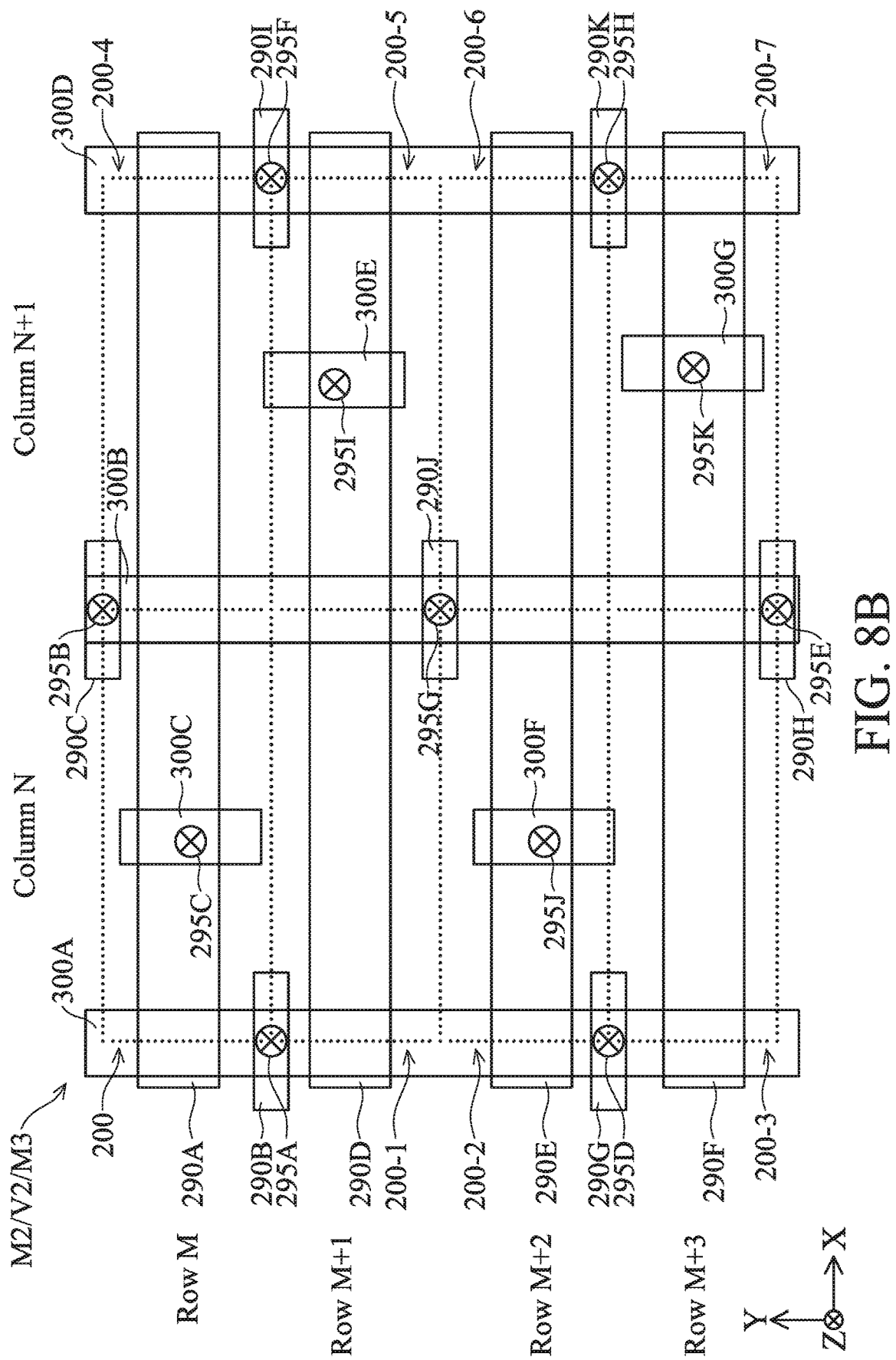
Figure 8C:
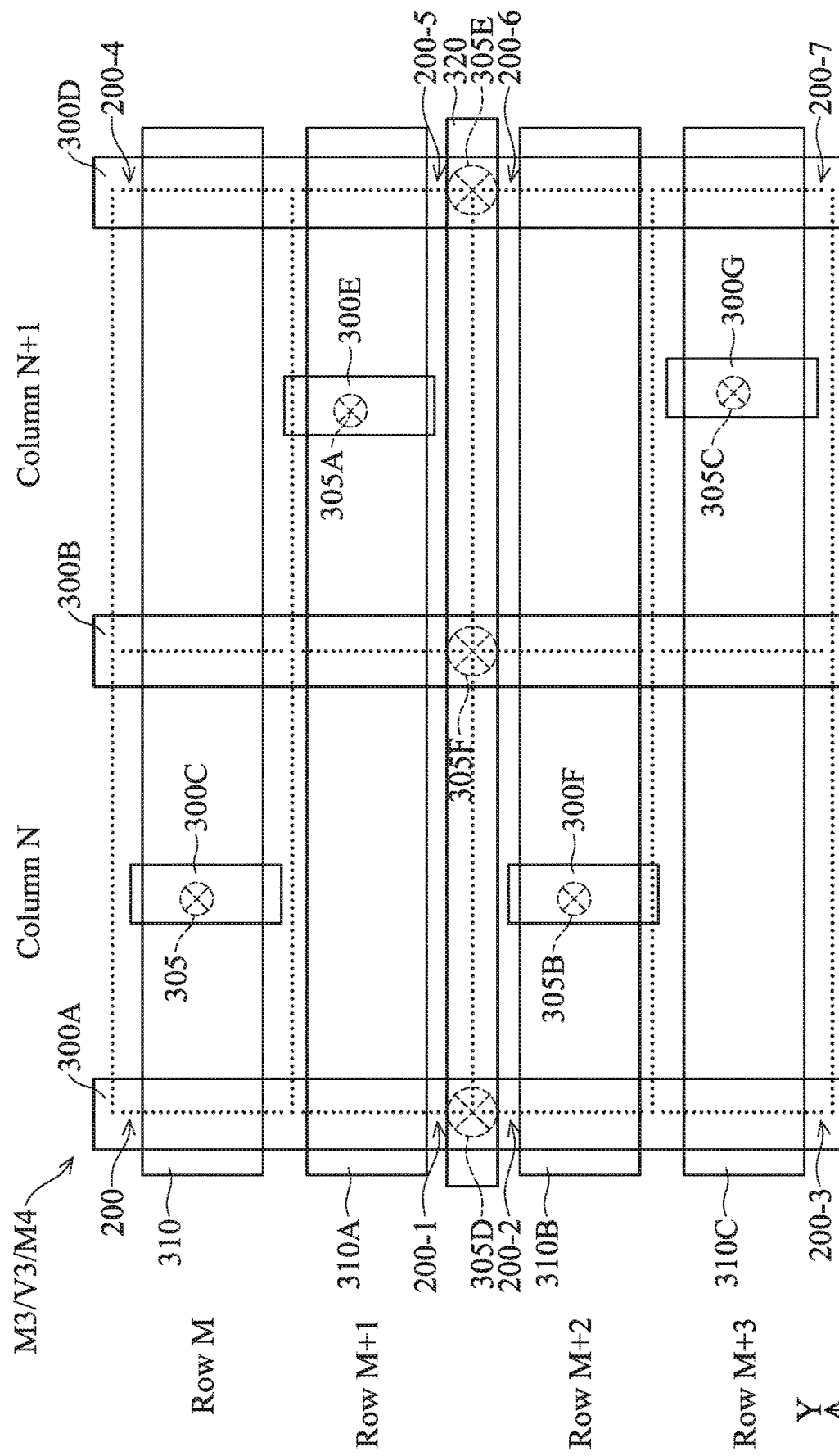

FIG. 8A, FIG. 8B, and FIG. 8C are various top, plan views of various layers of a memory having a double voltage line structure, in portion or entirety, according to various aspects of the present disclosure.

Figure 9A:
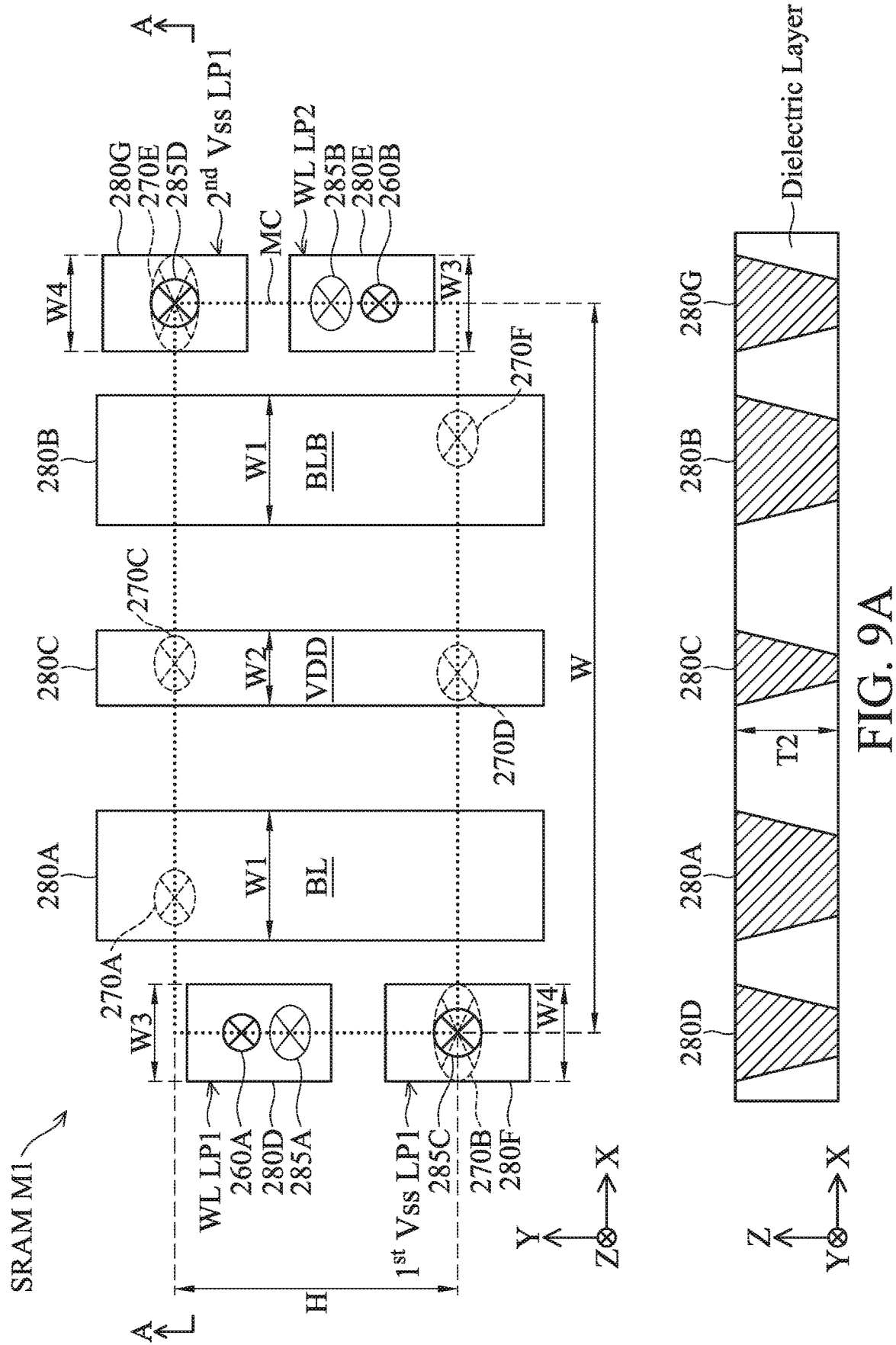
Figure 9B:
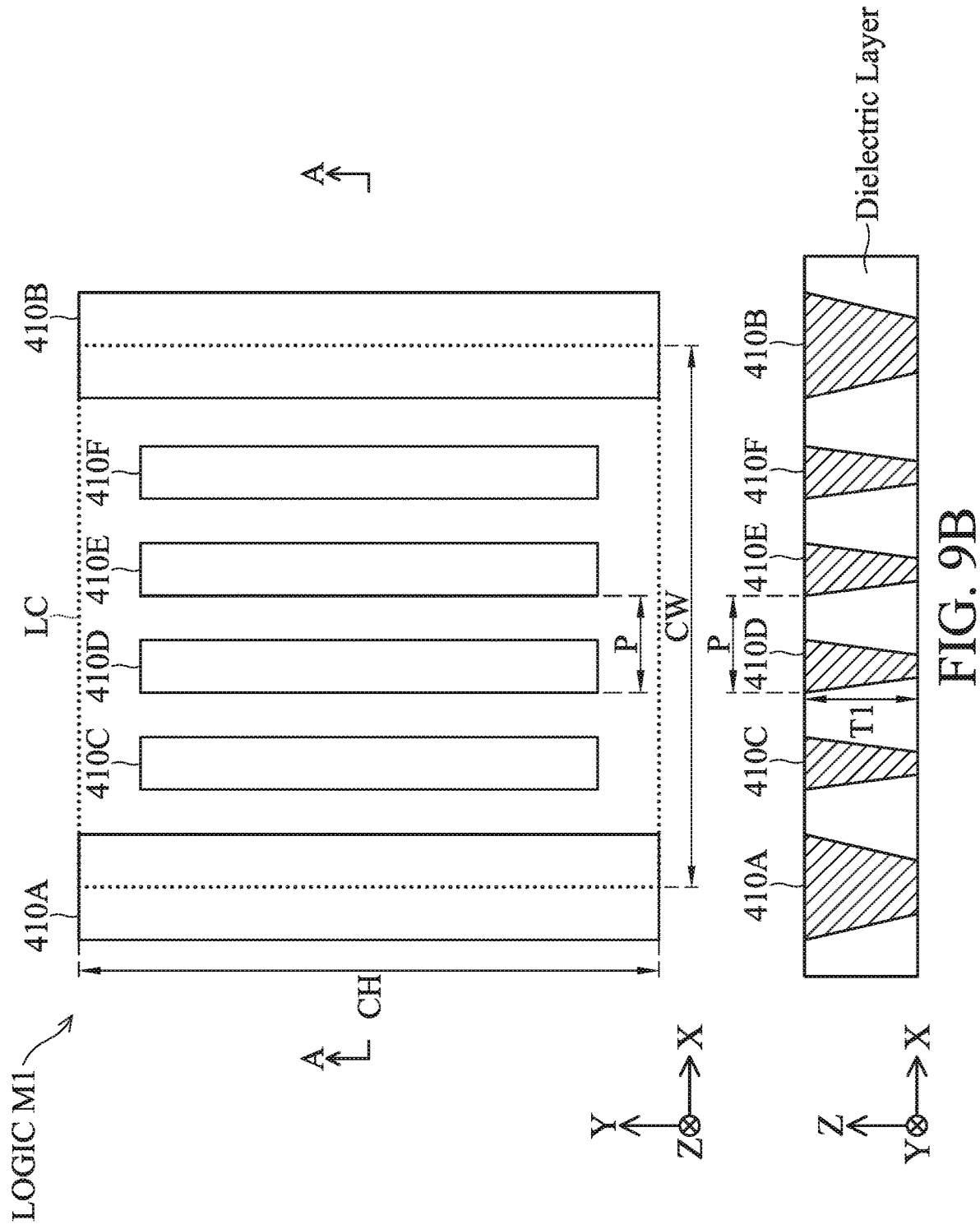

FIG. 9A and FIG. 9B are fragmentary, diagrammatic views of a bottommost metal layer of an interconnect structure of an SRAM cell and a logic cell, respectively, in portion or entirety, according to various aspects of the present disclosure.

Figure 10:
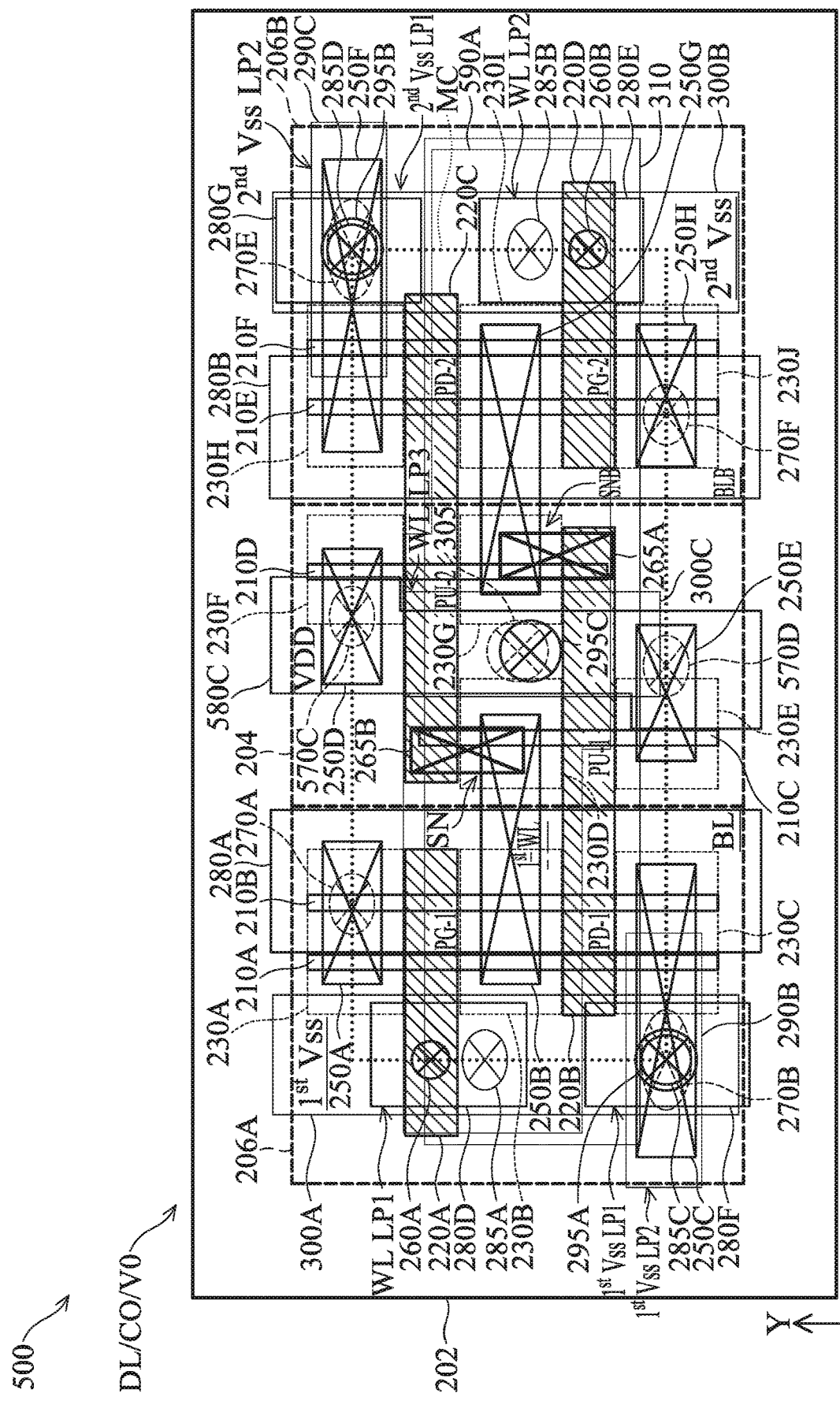

FIG. 10 is a top, plan view of an SRAM cell, in portion or entirety, having a voltage line and a word line with varying width according to various aspects of the present disclosure.

FIG. 11A, FIG. 11B, FIG. 11C, FIG. 11D, and FIG. 11E are various top, plan views of various layers of the memory cell of FIG. 10, in portion or entirety, according to various aspects of the present disclosure.

DETAILED DESCRIPTION

The present disclosure relates generally to integrated circuit (IC) devices, and more particularly, to interconnect structures for memory-based IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Configurations of metal layers of interconnect structures are disclosed herein that can improve memory performance, such as static random-access memory (SRAM) memory performance, and/or logic performance. For example, embodiments herein place bit lines in a metal one layer, which is a lowest metallization level of an interconnect structure of a memory cell, to minimize bit line capacitance, and configure bit lines as the widest metal lines of the metal one layer to minimize bit line resistance. In some embodiments, the interconnect structure has a double word line structure to reduce word line resistance. In some embodiments, word line straps (i.e., connections) in the double word line-structure are configured and placed within a memory to reduce word line resistance. In some embodiments, the interconnect structure has a double voltage line structure to reduce voltage line resistance. In some embodiments, jogs are added to a word line and/or a voltage line to reduce its respective resistance. In some embodiments, via shapes of the interconnect structure are configured to reduce resistance of the interconnect structure. In some embodiments, dimensions of metal lines of the metal one layer in a memory region are configured relative to metal lines of the metal one layer in a logic region to co-optimize memory performance and logic performance, for example, by minimizing resistance. SRAM configurations disclosed herein thus optimize electrical characteristics and SRAM density, as described below. Different embodiments may have different advantages, and no particular advantage is required of any embodiment.

Figure 1:
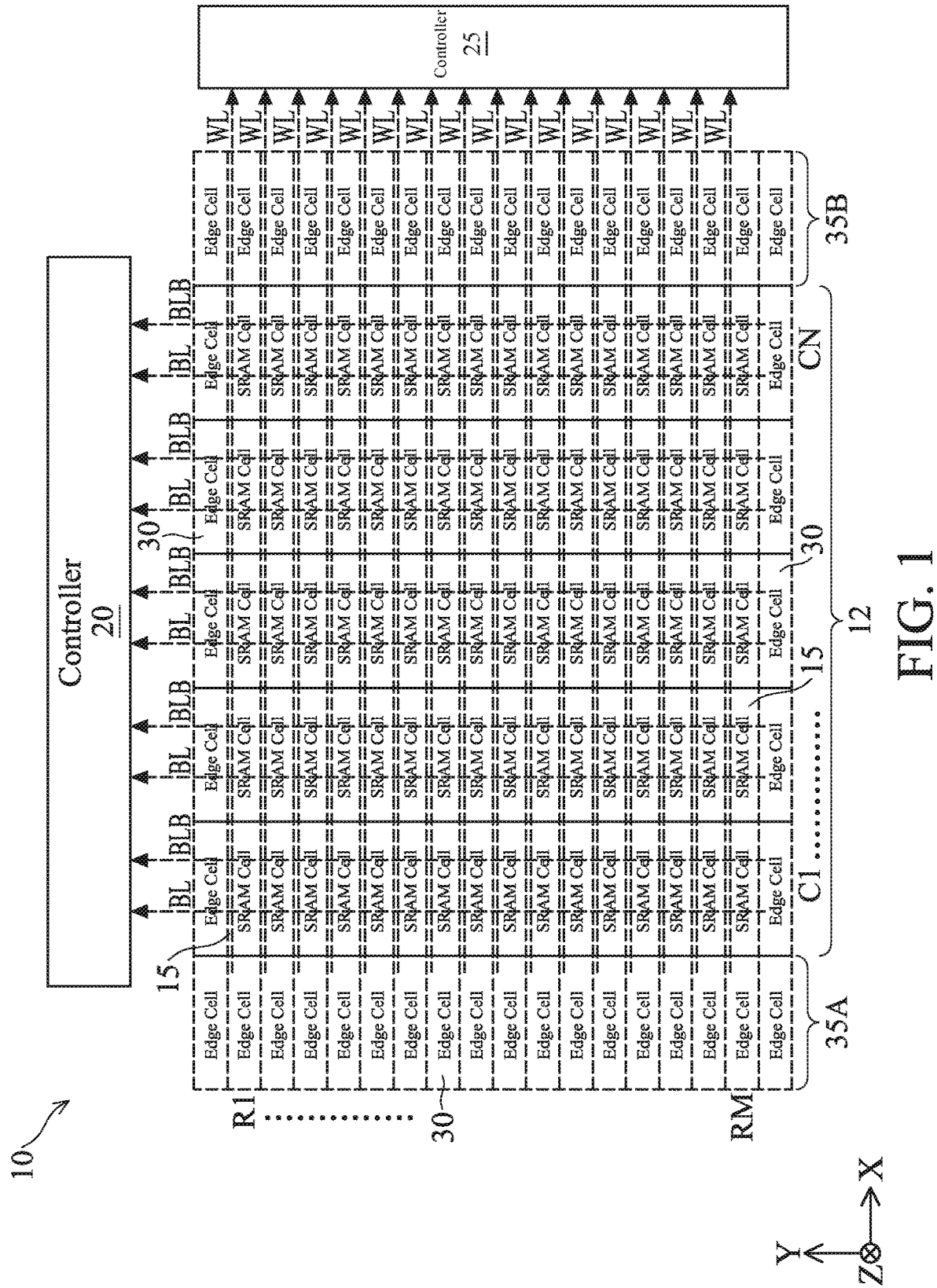
FIG. 1 is a fragmentary diagrammatic plan view of a memory, such as a static random-access memory (SRAM), according to various aspects of the present disclosure.

FIG. 1 is a fragmentary diagrammatic plan view of a memory 10 according to various aspects of the present disclosure. Memory 10 may be included in a microprocessor, a memory, and/or other IC device. In some embodiments, memory 10 may be a portion of an IC chip, a system on chip (SoC), or portion thereof, that includes various passive and active electronic devices such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various transistors may be planar transistors or multi-gate transistors, such as FinFETs or GAA transistors, depending on design requirements of memory 10. FIG. 1 has been simplified for the sake of clarity to better understand the inventive concepts of the present disclosure. Additional features can be added in memory 10, and some of the features described below can be replaced, modified, or eliminated in other embodiments of memory 10.

Memory 10 includes a memory array 12 that includes memory cells 15 (also referred to as bit cells) for storing data. In some embodiments, memory 10 is configured as a static random-access memory (SRAM) and memory cells 15 are SRAM cells. Memory cells 15 include various transistors, such as p-type transistors and/or n-type transistors, configured to facilitate reading and writing of data to memory cells 15. Memory cells 15 are arranged in a column 1 (C1) to a column N (CN) extending along a first direction (e.g., a y-direction) and a row 1 (R1) to a row M (RM) extending along a second direction (e.g., an x-direction), where N and M are positive integers. Column C1 to column CN each include a bit line pair extending along the first direction, such as a bit line (BL) and a bit line bar (BLB) (also referred to as a complementary bit line), that facilitate reading data from and/or writing data to respective memory cells 15 in true form and complementary form on a column-by-column basis. Row R1 to row RM each include a word line (WL) that facilitates access to respective memory cells 15 on a row-by-row basis. Each memory cell 15 is electrically connected to a respective BL, a respective BLB, and a respective WL. BLs and BLBs are electrically connected to a controller 20, and WLs are electrically connected to a controller 25. Controller 20 and controller 25 are configured to generate one or more signals to select at least one WL and at least one bit line pair (here, BL and BLB) to access at least one of memory cells 15 for read operations and/or write operations. Controller 20 and controller 25 each include circuitry for facilitating read/write operations, such as a column decoder circuit, a row decoder circuit, a column selection circuit, a row selection circuit, a read/write circuit (for example, configured to read data from and/or write data to memory cells 15 corresponding to a selected bit line pair (in other words, a selected column)), other suitable circuitry, or combinations thereof. In some embodiments, controller 20 and/or controller 25 include at least one sense amplifier configured to detect and/or amplify a voltage differential of a selected bit line pair. In some embodiments, the sense amplifier is configured to latch or otherwise store data values of the voltage differential.

A perimeter of memory 10 is configured with dummy cells, such as edge dummy cells and/or well strap cells, to facilitate uniformity in fabrication and/or performance of memory cells 15. Dummy cells are configured physically and/or structurally similar to memory cells 15, but do not store data. For example, dummy cells can include p-type wells, n-type wells, channels (e.g., formed in one or more fins or one or more suspended channel layers (e.g., nanowires or nanosheets)), gate structures, source/drains, and/or interconnects (e.g., contacts, vias, and/or metal lines). Well strap cells generally refer to dummy cells that are configured to electrically connect a voltage to an n-well of memory cells 15, a p-well of memory cells 15, or both. For example, an n-type well strap is configured to electrically couple an n-well that corresponds with at least one p-type transistor of memory cells 15 to a voltage source, and a p-type well strap is configured to electrically couple a p-well that corresponds with at least one n-type transistor of memory cells 15 to a voltage source. In the depicted embodiment, memory 10 includes edge cells 30 (which collectively refers to edge cells, well strap cells, and/or other dummy cells) arranged along the first direction (e.g., y-direction) into an edge cell column 35A and an edge cell column 35B, where each of row R1 to row RM of memory cells 15 is disposed between one of edge dummy cells 30 in edge dummy cell column 35A and one of edge dummy cells 30 in edge dummy cell column 35B. In furtherance of the depicted embodiment, each of column C1 to column CN of memory cells 15 is disposed between a respective pair of edge cells 30. In some embodiments, edge cell column 35A and/or edge cell column 35B extend substantially parallel to at least one bit line pair (here, BL and BLB) of memory 10. In some embodiments, edge cells 30 connect respective memory cells 15 to respective WLs. In some embodiments, edge cells 30 include circuitry for driving WLs. In some embodiments, edge cells 30 are electrically connected to a power supply voltage $V_{DD}$ (for example, a positive power supply voltage) and/or a power supply voltage $V_{SS}$ (for example, an electrical ground).

Figure 2:
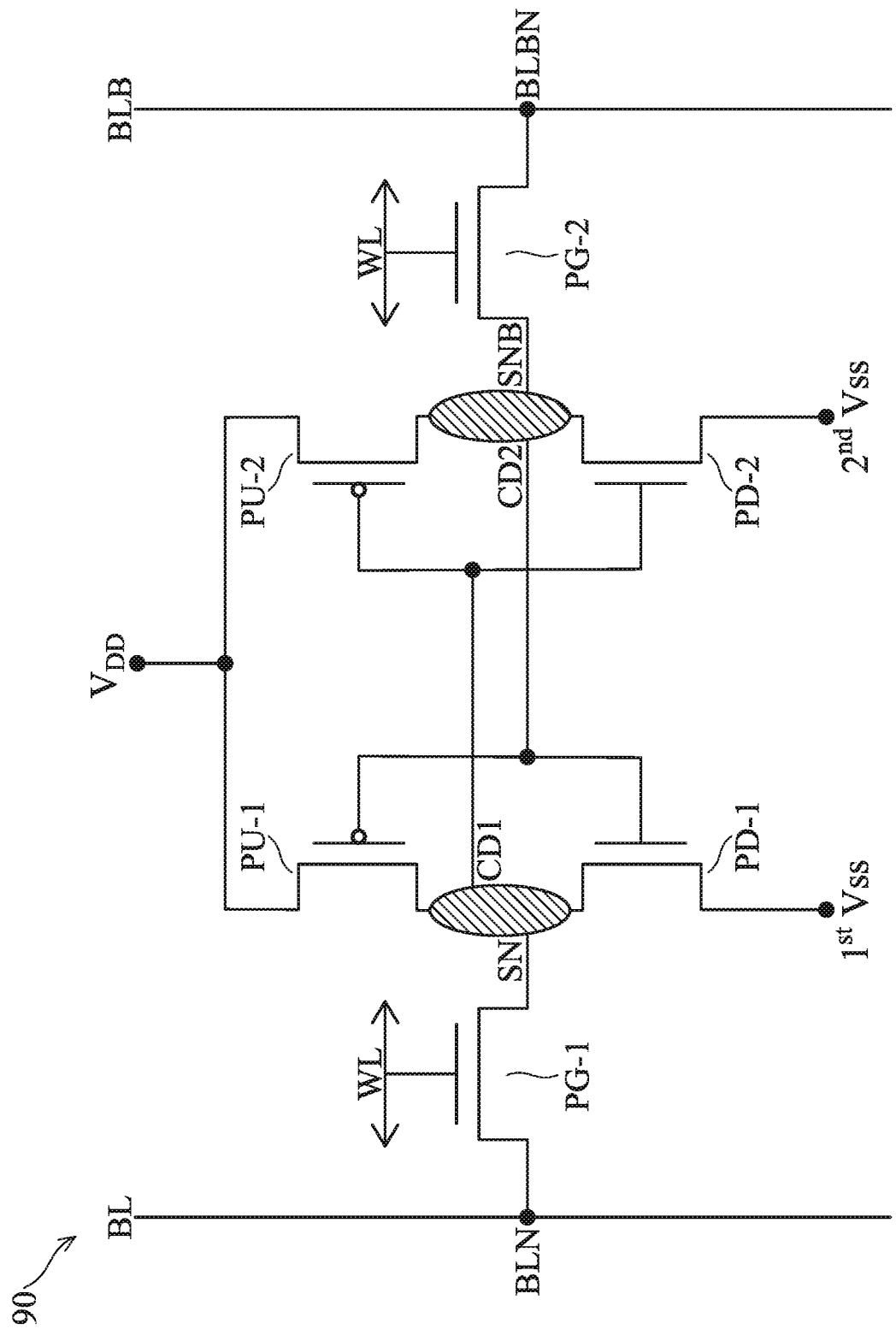
FIG. 2 is a circuit diagram of a memory cell, such as an SRAM cell, that can be implemented in the memory of FIG. 1, according to various aspects of the present disclosure.
Figure 3:
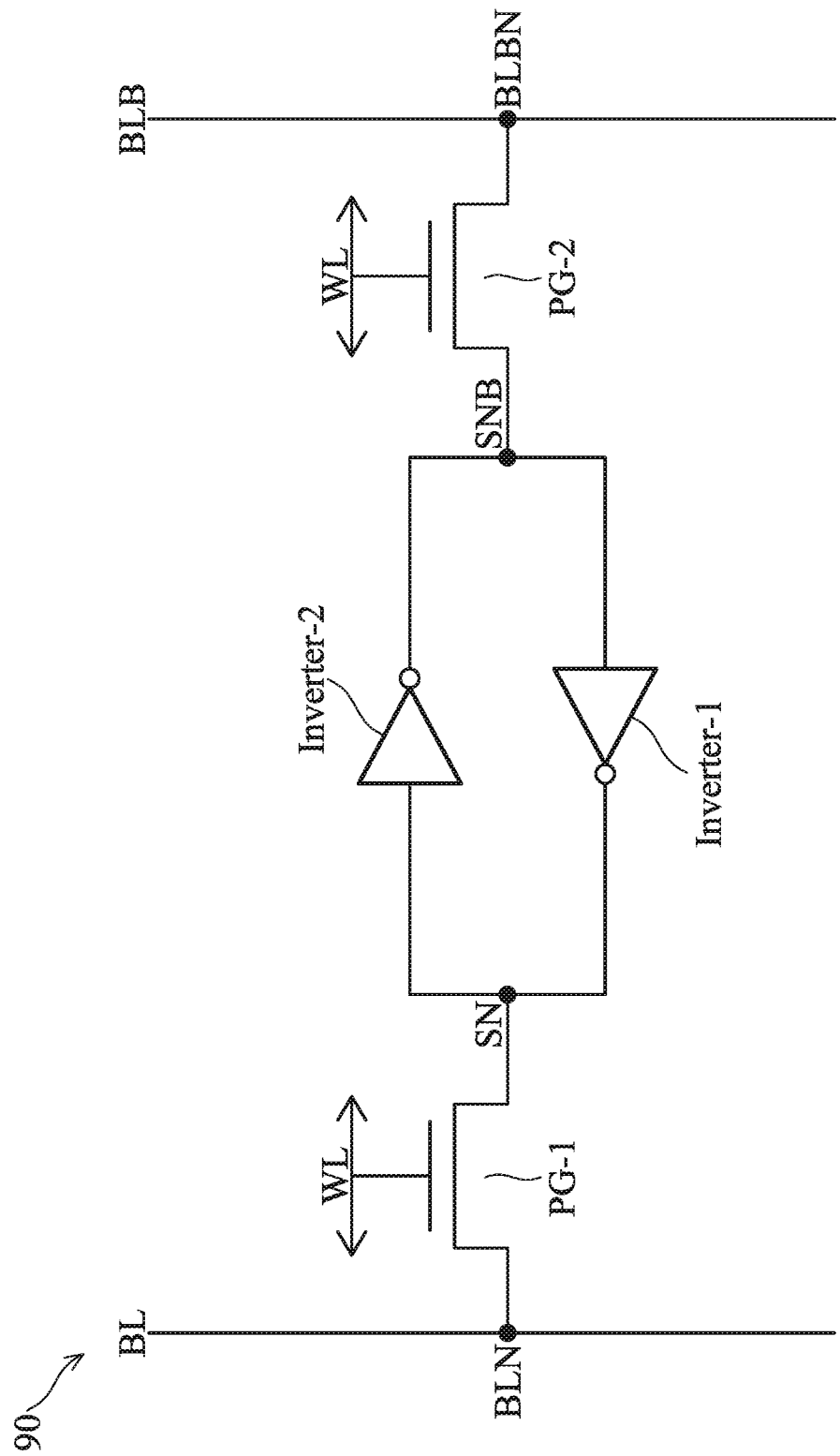
FIG. 3 is another circuit diagram of a memory cell, such as an SRAM cell, that can be implemented in the memory of FIG. 1, according to various aspects of the present disclosure.

FIG. 2 is a circuit diagram of an SRAM circuit 90, which can be implemented in a memory cell of an SRAM, according to various aspects of the present disclosure. FIG. 3 is an alternative circuit diagram of SRAM circuit 90 according to various aspects of the present disclosure, which will be discussed concurrently with FIG. 2. In some embodiments, one or more of memory cells 15 is configured as SRAM circuit 90. SRAM circuit 90 includes six transistors: a pass-gate transistor PG-1, a pass-gate transistor PG-2, a pull-up transistor PU-1, a pull-up transistor PU-2, a pull-down transistor PD-1, and a pull-down transistor PD-2. SRAM circuit 90 is thus alternatively referred to as a 6T SRAM cell. A storage portion of SRAM circuit 90 includes a cross-coupled pair of inverters (which can be referred to as a latch), such as an Inveter-1 and an Inverter-2 (FIG. 3). Inverter-1 includes pull-up transistor PU-1 and pull-down transistor PD-1, and Inverter-2 includes pull-up transistor PU-2 and pull-down transistor PD-2. Pass-gate transistor PG-1 is connected to an output of Inverter-1 and an input of Inveter-2, and pass-gate transistor PG-2 is connected to an output of Inverter-2 and an input of Inverter-1. In operation, pass-gate transistor PG-1 and pass-gate transistor PG-2 provide access to the storage portion of SRAM circuit 90 (i.e., Inverter-1 and Inverter-2) and can alternatively be referred to as access transistors of SRAM circuit 90. In the depicted embodiment, SRAM circuit 90 is a single-port SRAM cell. The present disclosure contemplates embodiments where SRAM circuit 90 is a multi-port SRAM cell, such as a dual-port SRAM cell, and/or includes more or less transistors, such as an 8T SRAM cell. FIG. 2 and FIG. 3 have been simplified for the sake of clarity to better understand the inventive concepts of the present disclosure. Additional features can be added in SRAM circuit 90, and some of the features described below can be replaced, modified, or eliminated in other embodiments of SRAM circuit 90.

SRAM circuit 90 is connected to and powered through a first power supply voltage, such as a positive power supply voltage, and a second power supply voltage, such as a ground voltage or a reference voltage (which can be an electrical ground). A gate of pull-up transistor PU-1 interposes a source, which is electrically coupled to the first supply voltage via voltage node $V_{DD}$, and a first common drain (CD1) (i.e., a drain of pull-up transistor PU-1 and a drain of pull-down transistor PD-1). A gate of pull-down transistor PD-1 interposes a source, which is electrically coupled to the second power supply voltage via a $1^{st}$ $V_{SS}$ node, and the first common drain. A gate of pull-up transistor PU-2 interposes a source, which is electrically coupled the first supply voltage via voltage node $V_{DD}$, and a second common drain (CD2) (i.e., a drain of pull-up transistor PU-2 and a drain of pull-down transistor PD-2). A gate of pull-down transistor PD-2 interposes a source, which is electrically coupled to the second power supply voltage via a $2^{nd}$ $V_{SS}$ node, and the second common drain. In some embodiments, the first common drain is a storage node SN that stores data in true form, and the second common drain is a storage node SNB that stores data in complementary form. The gate of pull-up transistor PU-1 and the gate of pull-down transistor PD-1 are coupled together and to the second common drain, and the gate of pull-up transistor PU-2 and the gate of pull-down transistor PD-2 are coupled together and to the first common drain. A gate of pass-gate transistor PG-1 interposes a drain connected to a bit line node (BLN), which is electrically coupled to a bit line BL, and a source, which is electrically coupled to the first common drain. A gate of pass-gate transistor PG-2 interposes a drain connected to a complementary bit line node (BLBN), which is electrically coupled to a complementary bit line BLB, and a source, which is electrically coupled to the second common drain. Gates of pass-gate transistors PG-1, PG-2 are connected to and controlled by a word line WL, which allows selection of SRAM circuit 90 for reading/writing. In some embodiments, pass-gate transistors PG-1, PG-2 provide access to storage nodes SN, SNB, which can store a bit (e.g., a logical 0 or a logical 1), during read operations and/or write operations. For example, pass-gate transistors PG-1, PG-2 couple storage nodes SN, SNB respectively to bit lines BL, BLB in response to voltage applied to gates of pass-gate transistors PG-1, PG-2 by WLs.

In some embodiments, pull-up transistors PU-1, PU-2 are configured as p-type multigate devices, such as p-type FinFETs or p-type GAA transistors, and pull-down transistors PD-1, PD-2 are configured as n-type multigate devices, such as n-type FinFETs or n-type GAA transistors. For example, pull-up transistors PU-1, PU-2 each include a gate structure disposed over a channel region of an n-type fin structure (including one or more n-type fins), such that the gate structure interposes p-type source/drain regions of the n-type fin structure (for example, p-type epitaxial source/drain features), where the gate structure and the n-type fin structure are disposed over an n-type well; and pull-down transistors PD-1, PD-2 each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well. In some embodiments, pass-gate transistors PG-1, PG-2 are also configured as n-type FinFETs. For example, pass-gate transistors PG-1, PG-2 each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well.

Figure 4:
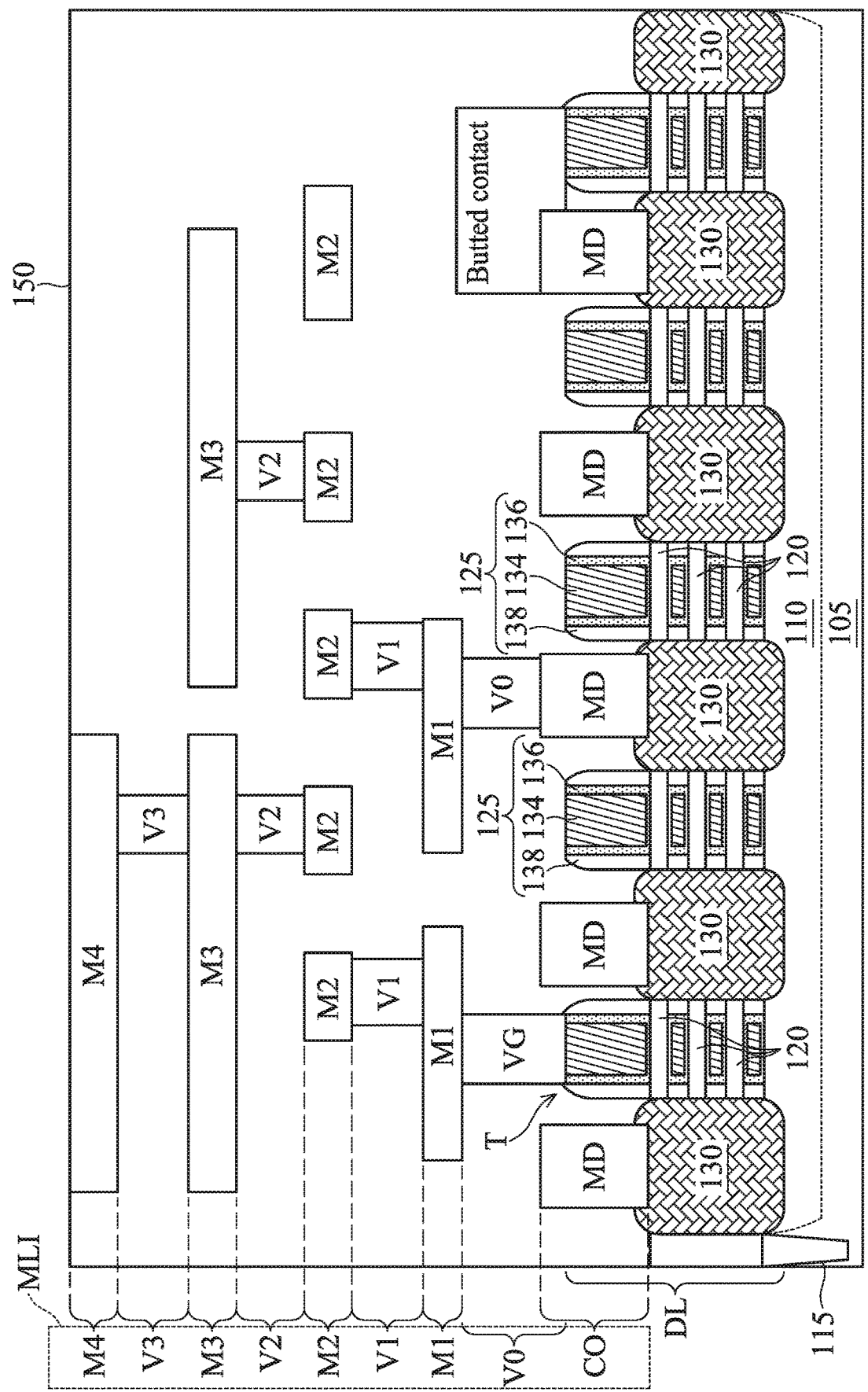
FIG. 4 is a fragmentary diagrammatic cross-sectional view of various layers of a memory, in portion or entirety, according to various aspects of the present disclosure.

FIG. 4 is a fragmentary diagrammatic cross-sectional view of various layers (levels) that can be fabricated over a semiconductor substrate (or wafer) 105 to form a portion of a memory, such as memory 10 of FIG. 1, and/or a portion of an SRAM cell, such as SRAM circuit 90 of FIG. 2 and FIG. 3, according to various aspects of the present disclosure. In FIG. 4, the various layers include a device layer DL and a multilayer interconnect MLI disposed over the device layer DL. Device layer DL includes devices (e.g., transistors, resistors, capacitors, and/or inductors) and/or device components (e.g., doped wells, gate structures, and/or source/drain features). In some embodiments, device layer DL includes substrate 105, doped regions 110 disposed in substrate 105 (e.g., n-wells and/or p-wells), isolation features 115, and transistors T. In the depicted embodiment, transistors T include suspended channel layers 120 and gate structures 125 disposed between source/drains 130, where gate structures 125 wrap and/or surround suspended channel layers 120. Each gate structure 125 has a metal gate stack formed from a gate electrode 134 disposed over a gate dielectric 136 and gate spacers 138 disposed along sidewalls of the metal gate stack. Multilayer interconnect MLI electrically couples various devices and/or components of device layer DL, such that the various devices and/or components can operate as specified by design requirements for the memory. In the depicted embodiment, multilayer interconnect MLI includes a contact layer (CO level or metal zero (M0) level), a via zero layer (V0 level), a metal one layer (M1 level), a via one layer (V1 level), a metal two layer (M2 level), a via two layer (V2 level), a metal three layer (M3 level), a via three layer (V3 level), and a metal four layer (M4 level). The present disclosure contemplates multilayer interconnect MLI having more or less layers and/or levels, for example, up to an MX level and a V(X−1) level, where X is a total number of metal layers (levels) of the multilayer interconnect MLI. Each level of multilayer interconnect MLI includes conductive features (e.g., metal lines, metal vias, and/or metal contacts) disposed in one or more dielectric layers (e.g., an interlayer dielectric (ILD) layer and a contact etch stop layer (CESL)). In some embodiments, conductive features at a same level of multilayer interconnect MLI, such as M1 level, are formed simultaneously. In some embodiments, conductive features at a same level of multilayer interconnect MLI have top surfaces that are substantially planar with one another and/or bottom surfaces that are substantially planar with one another. CO level includes source/drain contacts (MD) disposed in a dielectric layer 150; V0 level includes gate vias VG, source/drain vias V0, and butted contacts disposed in dielectric layer 150; M1 level includes M1 metal lines disposed in dielectric layer 150, where gate vias VG connect gate structures 125 to M1 metal lines, source/drain vias V0 connect source/drains 130 to M1 metal lines, and butted contacts connect gate structures 125 and source/drains 130 together and to M1 metal lines; V1 level includes V1 vias disposed in dielectric layer 150, where V1 vias connect M1 metal lines to M2 metal lines; M2 level includes M2 metal lines disposed in dielectric layer 150; V2 level includes V2 vias disposed in dielectric layer 150, where V2 vias connect M2 lines to M3 lines; M3 level includes M3 metal lines disposed in dielectric layer 150; V3 level includes V3 vias disposed in dielectric layer 150, where V3 vias connect M3 lines to M4 lines. FIG. 4 has been simplified for the sake of clarity to better understand the inventive concepts of the present disclosure. Additional features can be added in the various layers of the memory, and some of the features described can be replaced, modified, or eliminated in other embodiments of the memory. FIG. 4 is merely an example and may not reflect an actual cross-sectional view of memory 10 and/or SRAM circuit 90.

Figure 6A:
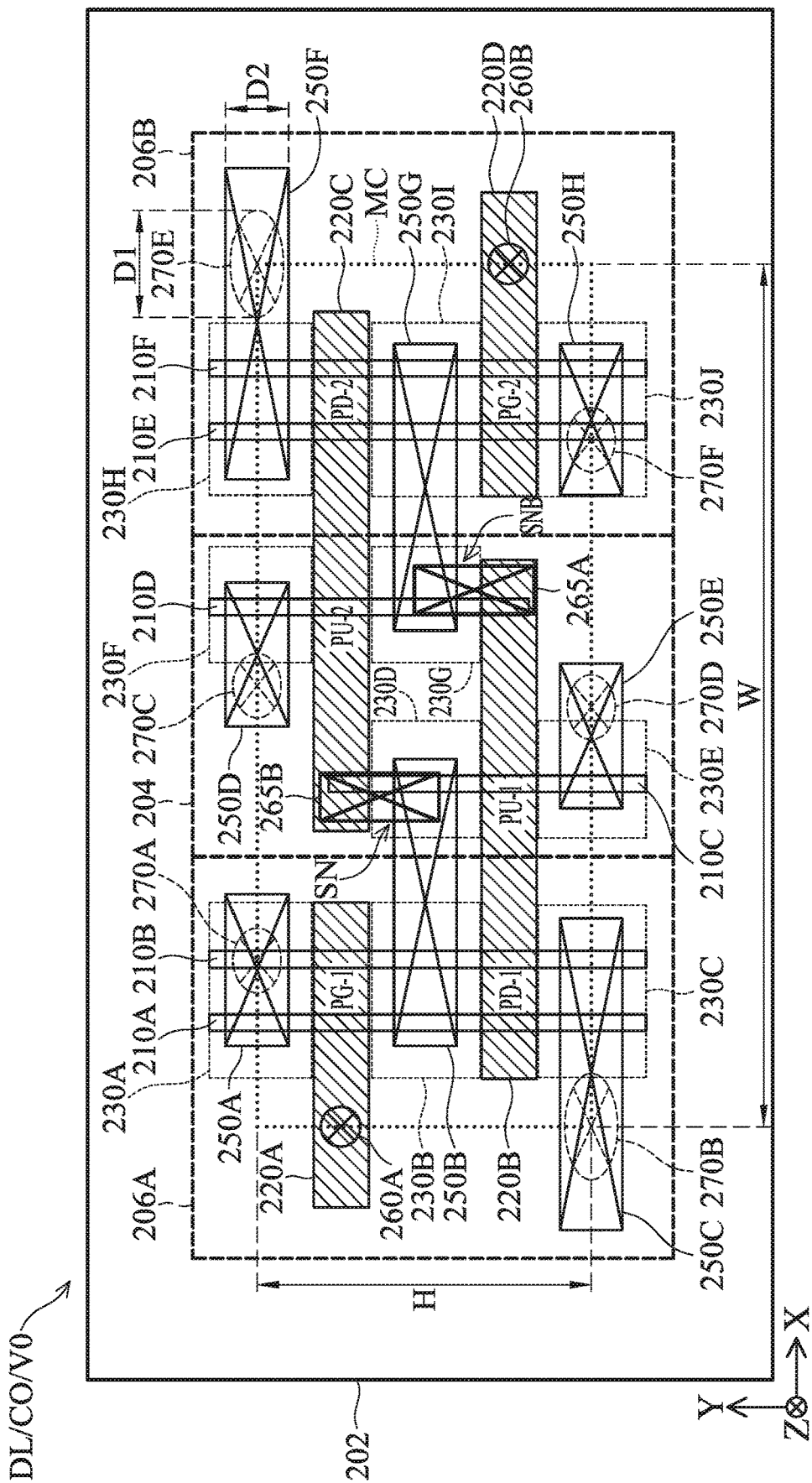
Figure 6B:
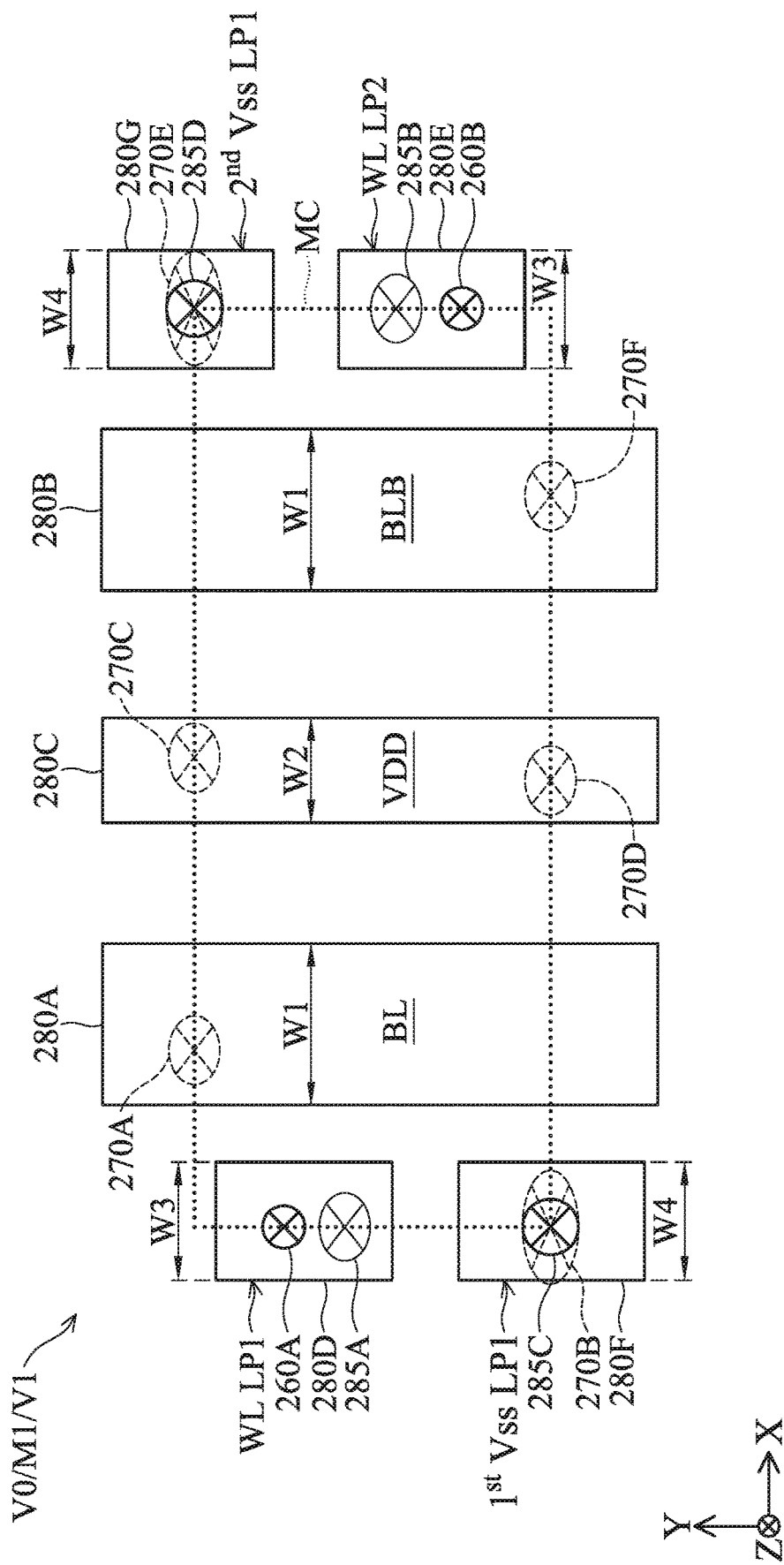
Figure 6C:
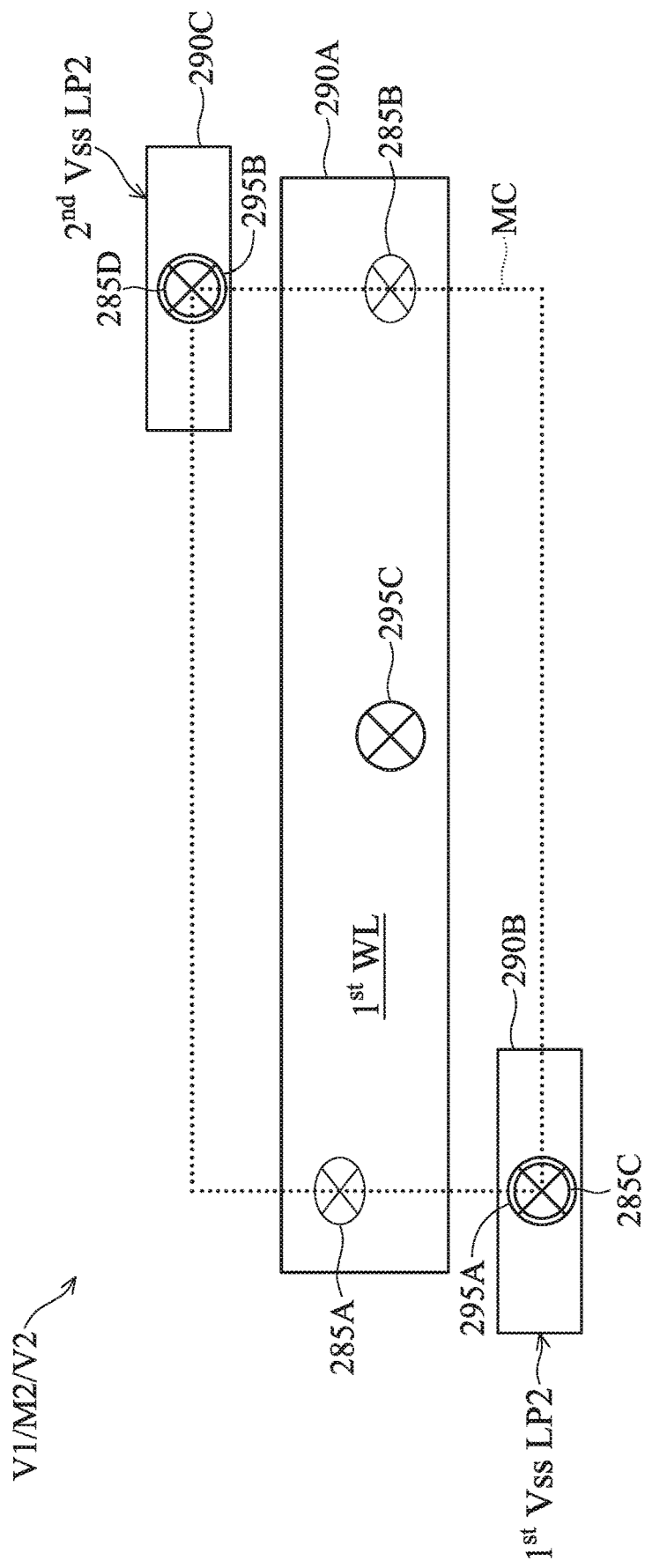
Figure 6D:
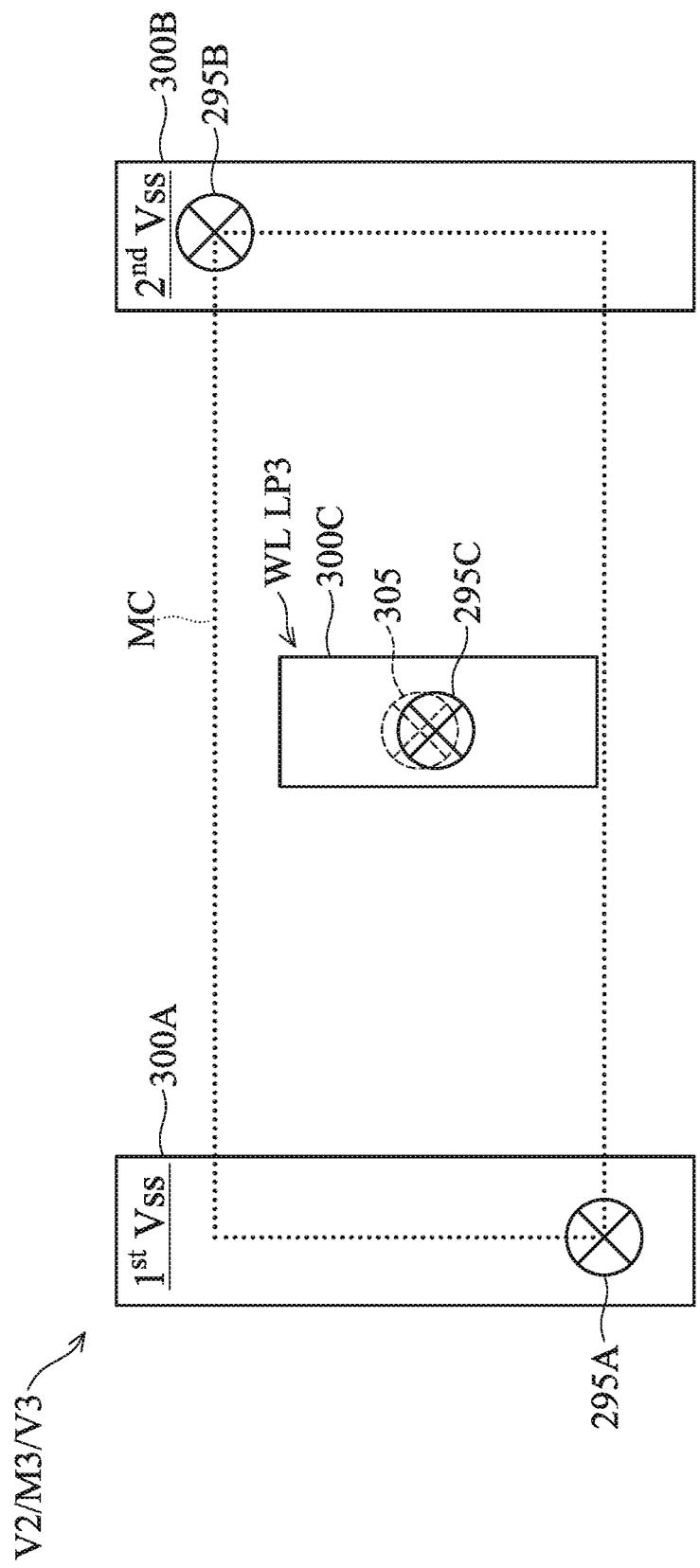
Figure 6E:
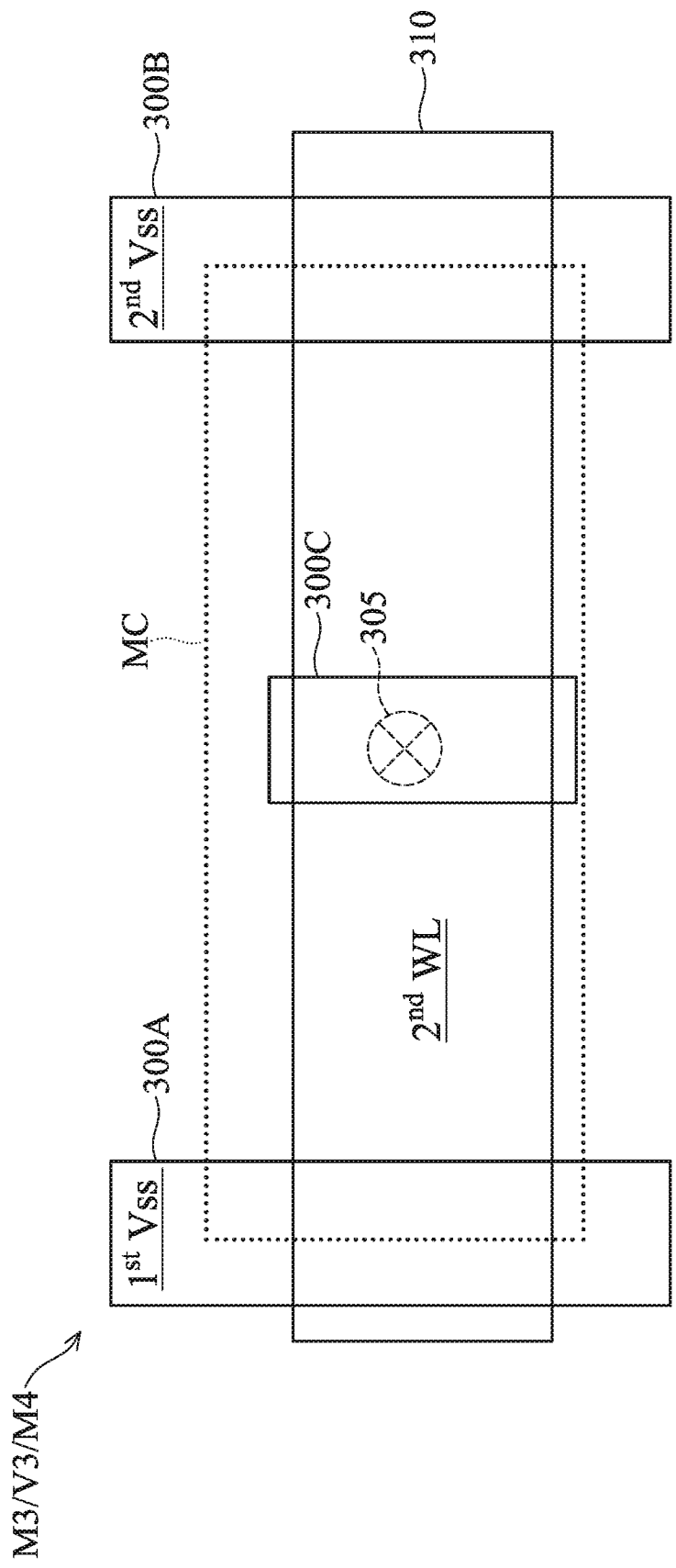

FIG. 5A and FIG. 5B are fragmentary diagrammatic views of an SRAM cell 200, in portion or entirety, according to various aspects of the present disclosure. In particular, FIG. 5A is a top, plan view of SRAM cell 200, and FIG. 5B is a diagrammatic cross-sectional view of SRAM cell 200 along line A-A of FIG. 5A. FIGS. 6A-6E are various top, plan views of various layers of SRAM cell 200 of FIG. 5A and FIG. 5B according to various aspects of the present disclosure. For example, FIG. 6A is a top, plan view of a device layer (DL) and conductive features in a contact (CO) layer and a via zero (V0) layer (e.g., DL/CO/V0), in portion or entirety, of SRAM cell 200 according to various aspects of the present disclosure; FIG. 6B is a top, plan view of conductive features in V0 layer, a metal one (M1) layer and a via one (V1) layer (e.g., V0/M1/V1), in portion or entirety, of SRAM cell 200 according to various aspects of the present disclosure; FIG. 6C is a top, plan view of conductive features in V1 layer, a metal two (M2) layer and a via two (V2) layer (e.g., V1/M2/V2), in portion or entirety, of SRAM cell 200 according to various aspects of the present disclosure; FIG. 6D is a top, plan view of conductive features in V2 layer, a metal three (M3) layer, and a via three (V3) layer (e.g., V2/M3/V3), in portion or entirety, of SRAM cell 200 according to various aspects of the present disclosure; and FIG. 6E is a top, plan view of conductive features in M3 layer, V3 layer, and a metal four (M4) layer (e.g., M3/V3/M4), in portion or entirety, of SRAM cell 200 according to various aspects of the present disclosure. CO layer connects device layer to V0 layer, V0 layer connects CO layer to M1 layer, V1 layer connects M1 layer to M2 layer, V2 layer connects M2 layer to M3 layer, and V3 layer connects M3 layer to M4 layer. SRAM cell 200 may be implemented in memory 10 of FIG. 1. In some embodiments, the features of SRAM cell 200 are configured to provide an SRAM circuit, such as depicted in FIG. 2 and/or FIG. 3. FIG. 5A, FIG. 5B, FIG. 6A, FIG. 6B, FIG. 6C, FIG. 6D, and FIG. 6E have been simplified for the sake of clarity to better understand the inventive concepts of the present disclosure. Additional features can be added in SRAM cell 200, and some of the features described below can be replaced, modified, or eliminated in other embodiments of SRAM cell 200.

SRAM cell 200 has a cell boundary MC, which has a first dimension, such as a cell width W, along a first direction (e.g., x-pitch along an x-direction) and a second dimension, such as a cell height H, along a second direction (e.g., y-pitch along a y-direction). In some embodiments, such as depicted, cell width W is greater than cell height H. For example, a ratio of cell width W to a ratio of cell height H is greater than one. Where SRAM cell 200 is repeated in a memory array, such as memory array 12, cell width W may represent and be referred to as a memory cell pitch in the memory array along an x-direction and cell height H may represent and be referred to as a memory cell pitch in the memory array along a y-direction.

Device layer includes device components and/or device features, such as a substrate (wafer) 202, an n-well 204 disposed in substrate 202, a p-well 206A and a p-well 206B disposed in substrate 202, fins 210A-210F (also referred to as fin structures or active fin regions) disposed over and/or extending from substrate 202, isolation features 215 disposed in and/or over substrate 202, gate structures 220A-220D disposed over substrate 202 and isolation features 215, and epitaxial source/drain features 230A-230J. Fins 210A-210F are oriented substantially parallel to one another and extend lengthwise along the y-direction (i.e., length is defined in the y-direction, width is defined in the x-direction, and height is defined in the z-direction), and gate structures 220A-220D are oriented substantially parallel to one another and extend lengthwise along the x-direction (i.e., length is defined in the x-direction, width is defined in the y-direction, and height is defined in the z-direction, such that gate structures 220A-220D are oriented substantially orthogonal to fins 210A-210F). Gate structure 220A wraps a first channel region of fin 210A and a first channel region of fin 210B and is disposed between epitaxial source/drain feature 230A and epitaxial source/drain feature 230B, both of which are disposed over and/or in source/drain regions of fin 210A and source/drain regions of fin 210B. Gate structure 220B wraps a second channel region of fin 210A, a second channel region of fin 210B, and a channel region of fin 210C, is disposed between epitaxial source/drain feature 230B and epitaxial source/drain feature 230C, both of which are disposed over and/or in source/drain regions of fin 210A and source/drain regions of fin 210B, and is disposed between epitaxial source/drain feature 230D and epitaxial source/drain feature 230E, both of which are disposed over and/or in source/drain regions of fin 210C. Gate structure 220C wraps a channel region of fin 210D, a first channel region of fin 210E, and a first channel region of fin 210F, is disposed between epitaxial source/drain feature 230F and epitaxial source/drain feature 230G, both of which are disposed over and/or in source/drain regions of fin 210D, and is disposed between epitaxial source/drain feature 230H and epitaxial source/drain feature 230I, both of which are disposed over and/or in source/drain regions of fin 210E and source/drain regions of fin 210F. Gate structure 220C further wraps an end region of fin 210C, such that gate structure 220C is disposed adjacent to epitaxial source/drain feature 230D. Gate structure 220D wraps a second channel region of fin 210E and a second channel region of fin 210F and is disposed between epitaxial source/drain feature 230I and epitaxial source/drain feature 230J, both of which are disposed over and/or in source/drain regions of fin 210E and source/drain regions of fin 210F. Gate structures 220A-220D engage respective channel regions of fins 210A-210F, such that current can flow between respective epitaxial source/drain features 230A-230J and/or respective source/drain regions of fins 210A-210F during operation. Gate structures 220A-220D each include a metal gate stack and gate spacers. For example, gate structure 220A has a metal gate stack that includes a gate dielectric 222A, a gate electrode 224A, and a hard mask 226A and gate spacers 228A disposed along sidewalls of the metal gate stack.

Device components and/or device features at device layer combine to form electronic devices. For example, SRAM cell 200 includes six transistors formed at device layer from the device components and/or device features, such as a pass-gate transistor PG-1, a pass-gate transistor PG-2, a pull-up transistor PU-1, a pull-up transistor PU-2, a pull-down transistor PD-1, and a pull-down transistor PD-2. Pull-down transistor PD-1 and pass-gate transistor PG-1 are multi-fin FinFETs (including, for example, fin 210A and fin 210B disposed over and electrically connected to p-well 206A), pull-up transistor PU-1 is a single fin FinFET (including, for example, fin 210C disposed over and electrically connected to n-well 204), pull-up transistor PU-2 is a single fin FinFET (including, for example, fin 210D disposed over and electrically connected to n-well 204), and pull-down transistor PD-2 and pass-gate transistor PG-2 are multi-fin FinFETs (including, for example, fin 210E and fin 210F disposed over and electrically connected to p-well 206B). Pass-gate transistor PG-1 has a gate (e.g., gate structure 220A) disposed between a source (e.g., epitaxial source/drain feature 230B) and a drain (e.g., epitaxial source/drain feature 230A). Pull-down transistor PD-1 has a gate (e.g., gate structure 220B) disposed between a source (e.g., epitaxial source/drain feature 230C) and a drain (e.g., epitaxial source/drain feature 230B). Pull-up transistor PU-1 has a gate (e.g., gate structure 220B) disposed between a source (e.g., epitaxial source/drain feature 230E) and a drain (e.g., epitaxial source/drain feature 230D). Pull-up transistor PU-2 includes a gate (e.g., gate structure 220C) disposed between a source (e.g., epitaxial source/drain feature 230F) and a drain (e.g., epitaxial source/drain feature 230G). Pull-down transistor PD-2 includes a gate (e.g., gate structure 220C) disposed between a source (e.g., epitaxial source/drain feature 230H) and a drain (e.g., epitaxial source/drain feature 230I). Pass-gate transistor PG-2 includes a gate (e.g., gate structure 220D) disposed between a source (e.g., epitaxial source/drain feature 230I) and a drain (e.g., epitaxial source/drain feature 230J). Sources/drains of pull-down transistors PD-1, PD-2, pass-gate transistors PG-1, PG-2, and/or pull-up transistors PU-1, PU-2 are also formed from respective source/drain regions of fins 210A-210F underlying epitaxial source/drain features 230A-230J. With such configuration, pull-down transistor PD-1 and pull-up transistor PU-1 share a gate (i.e., a gate of pull-down transistor PD-1 and a gate of pull-up transistor PU-1 are formed from respective portions of gate structure 220B), pull-down transistor PD-2 and pull-up transistor PU-2 share a gate (i.e., a gate of pull-down transistor PD-2 and a gate of pull-up transistor PU-2 are formed from respective portions of gate structure 220C), pass-gate transistor PG-1 and pull-down transistor PD-1 share epitaxial source/drain feature 230B (i.e., a source of pass-gate transistor PG-1 and a drain of pull-down transistor PD-1 are formed from epitaxial source/drain feature 230B), and pass-gate transistor PG-2 and pull-down transistor PD-2 share epitaxial source/drain feature 230I (i.e., a source of pass-gate transistor PG-2 and a drain of pull-down transistor PD-2 are formed from epitaxial source/drain feature 230I). In the depicted embodiment, pull-up transistors PU-1, PU-2 are configured as p-type FinFETs, and pull-down transistors PD-1, PD-2 and pass-gate transistors PG-1, PG-2 are configured as n-type FinFETs. In some embodiments, fin 210A, fin 210B, fin 210E, and fin 210F are p-doped (e.g., p-doped silicon fins); fin 210C and fin 210D are n-doped (e.g., n-doped silicon fins); epitaxial source/drain features 230A-230C and epitaxial source/drain features 230H-230J are n-doped (e.g., silicon or silicon carbon epitaxial source/drains doped with phosphorous, arsenic, and/or other n-type dopant); and epitaxial source/drain features 230D-230G are p-doped (e.g., silicon germanium epitaxial source/drains doped with boron, indium, and/or other p-type dopant).

CO layer includes conductive features, such as source/drain contacts 250A-250H (collectively referred to as device-level contacts), that connect device layer to conductive features of V0 layer, such as a gate via 260A, a gate via 260B, a butted gate contact 265A, and a butted gate contact 265B, and source/drain vias 270A-270F. Source/drain contact 250A is located between, physically contacts, and connects epitaxial source/drain feature 230A and source/drain via 270A. Source/drain contact 250B is physically contacts and connects epitaxial source/drain feature 230B and butted gate contact 265B. Source/drain contact 250B is further located between, physically contacts, and connects epitaxial source/drain feature 230E and butted gate contact 265B. Source/drain contact 250C is located between, physically contacts, and connects epitaxial source/drain feature 230C and source/drain via 270B. Source/drain contact 250D is located between, physically contacts, and connects epitaxial source/drain feature 230F and source/drain via 270C. Source/drain contact 250E is located between, physically contacts, and connects epitaxial source/drain feature 230E and source/drain via 270D. Source/drain contact 250F is located between, physically contacts, and connects epitaxial source/drain feature 230H and source/drain via 270E. Source/drain contact 250G is located between, physically contacts, and connects epitaxial source/drain feature 230G and butted gate contact 265A. Source/drain contact 250G further physically contacts and connects epitaxial source/drain feature 230I and butted gate contact 265A. Source/drain contact 250H is located between, physically contacts, and connects epitaxial source/drain feature 230J and source/drain via 270F. Butted gate contact 265A physically contacts gate structure 220B (for example, a gate electrode of gate structure 220B) and source/drain contact 250G, such that gate structure 220B is electrically connected to epitaxial source/drain feature 230G and epitaxial source/drain feature 230I by butted gate contact 265A and source/drain contact 250G. Butted gate contact 265B physically contacts gate structure 220C (for example, a gate electrode of gate structure 220C) and source/drain contact 250B, such that gate structure 220C is electrically connected to epitaxial source/drain feature 230D and epitaxial source/drain feature 230B by butted contact 265B and source/drain contact 250B. With such contact layer configuration, source/drain contact 250B electrically connects the drain of pull-down transistor PD-1 and the drain of pull-up transistor PU-1, such that a common drain of pull-down transistor PD-1 and pull-up transistor PU-1 can provide a storage node SN, which is electrically connected to the gate of pull-up transistor PU-2 and the gate of pull-down transistor PD-2 by butted gate contact 265B. Further, source/drain contact 250G electrically connects the drain of pull-down transistor PD-2 and the drain of pull-up transistor PU-2, such that a common drain of pull-down transistor PD-2 and pull-up transistor PU-2 form a storage node SNB, which is electrically connected to the gate of pull-up transistor PU-1 and the gate of pull-down transistor PD-1 by butted gate contact 265A and source/drain contact 250G.

Conductive features of CO layer, M1 layer, M2 layer, M3 layer, and M4 layer are routed along a first routing direction or a second routing direction that is different than the first routing direction. For example, the first routing direction is the x-direction (and substantially parallel with the lengthwise direction of gate structures 220A-220D) and the second routing direction is the y-direction (and substantially parallel with the lengthwise direction of fins 210A-210F). In the depicted embodiment, source/drain contacts 250A-250H have longitudinal (lengthwise) directions substantially along the x-direction (i.e., first routing direction), and butted gate contacts 265A, 265B have longitudinal directions substantially along the y-direction (i.e., second routing direction). In other words, a longest dimension (e.g., length) of source/drain contacts 250A-250H is along the x-direction, and a longest dimension of butted gate contacts 265A, 265B is along the y-direction. Source/drain contacts 250A-250H and butted gate contacts 265A, 265B are substantially rectangular-shaped (i.e., each has a length greater than its width), but the present disclosure contemplates source/drain contacts 250A-250H and/or butted gate contacts 265A, 265B having different shapes and/or combinations of shapes to optimize and/or improve performance (e.g., reduce resistance) and/or layout footprint (e.g., reduce density). Source/drain contact 250A spans fin 210A and fin 210B; source/drain contact 250B spans fin 210A, fin 210B, and fin 210C; source/drain contact 250C spans fin 210A and fin 210B; source/drain contact 250D spans fin 210D; source/drain contact 250E spans fin 210C; source/drain contact 250F spans fin 210E and fin 210F; source/drain contact 250G spans fin 210D, fin 210E, and fin 210F; and source/drain contact 250H spans fin 210E and fin 210F. In the depicted embodiment, source/drain contact 250A, source/drain contact 250D, and source/drain contact 250F overlap an upper edge of cell boundary MC, and source/drain contact 250C, source/drain contact 250E, and source/drain contact 250H overlap a lower edge of cell boundary MC. In some embodiments, source/drain contact 250A, source/drain contact 250D, and source/drain contact 250F overlap two memory cells, such as SRAM cell 200 and a memory cell directly above and adjacent to the upper edge of SRAM cell 200. In some embodiments, source/drain contact 250C, source/drain contact 250E, and source/drain contact 250H overlap two memory cells, such as SRAM cell 200 and a memory cell directly below and adjacent to the lower edge of SRAM cell 200. In furtherance of the depicted embodiment, source/drain contact 250C also overlaps a left edge of cell boundary MC and source/drain contact 250F also overlaps a right edge of cell boundary MC. In some embodiments, source/drain contact 250C overlaps a third memory cell, such as a memory cell directly adjacent to the left edge of SRAM cell 200, and/or source/drain contact 250F overlaps a third memory cell, such as a memory cell directly adjacent to the right edge of SRAM cell 200.

The conductive features of V0 layer, such as gate via 260A, gate via 260B, and source/drain vias 270A-270F, connect CO layer to conductive features of M1 layer, such as a bit line 280A, a bit line bar 280B, a first voltage line (e.g., a $V_{DD}$ line 280C) electrically connected to a first voltage (e.g., a positive supply voltage, such as $V_{DD}$), word line landing pads (e.g., a word line landing pad 280D (WL LP1) and a word line landing pad 280E (WL LP2)) that correspond with a word line of SRAM cell 200, a voltage line landing pad (e.g., a $1^{st}$ $V_{SS}$ landing pad 280F ($1^{st}$ $V_{SS}$ LP1)) that corresponds with a second voltage line of SRAM cell 200 that is electrically connected to a second voltage (e.g., a ground voltage, such as $V_{SS}$), and a voltage line landing pad (e.g., a $2^{nd}$ $V_{SS}$ landing pad 280G ($2^{nd}$ $V_{SS}$ LP1)) that corresponds with a third voltage line of SRAM cell 200 that is also electrically connected to the second voltage (e.g., $V_{SS}$). Source/drain via 270A is located between, physically contacts, and connects source/drain contact 250A to bit line 280A, and source/drain via 270F is located between, physically contacts, and connects source/drain contact 250H to bit line bar 280B. Source/drain via 270C is located between, physically contacts, and connects source/drain contact 250D to $V_{DD}$ line 280C, and source/drain via 270D is located between, physically contacts, and connects source/drain contact 250E to $V_{DD}$ line 280C. With such configuration, the drain of pass-gate transistor PG-1 is electrically connected to bit line 280A by source/drain contact 250A and source/drain via 270A, the drain of pass-gate transistor PG-2 is electrically connected to bit line bar 280B by source/drain contact 250H and source/drain via 270F, the source of pull-up transistor PU-1 is electrically connected to $V_{DD}$ line 280C by source/drain contact 250E and source/drain via 270D, and the source of pull-up transistor PU-2 is electrically connected to $V_{DD}$ line 280C by source/drain contact 250D and source/drain via 270C. Gate via 260A is located between, physically contacts, and connects gate structure 220A (e.g., a gate electrode thereof) to word line landing pad 280D. Gate via 260B is located between, physically contacts, and connects gate structure 220D (e.g., a gate electrode thereof) to word line landing pad 280E. Source/drain via 270B is located between, physically contacts, and connects source/drain contact 250C to $1^{st}$ $V_{ss}$ landing pad 280F, and source/drain via 270E is located between, physically contacts, and connects source/drain contact 250F to $2^{nd}$ $V_{SS}$ landing pad 280G.

V1 layer includes conductive features, such as vias 285A-285D, that connect M1 layer to conductive features of M2 layer, such as a $1^{st}$ word line 290A, a voltage line landing pad (e.g., a $1^{st}$ $V_{SS}$ landing pad 290B ($1^{st}$ $V_{SS}$ LP2)) that corresponds with the second voltage line, and a voltage line landing pad (e.g., a $2^{nd}$ $V_{SS}$ landing pad 290C ($2^{nd}$ $V_{SS}$ LP2)) that corresponds with the third voltage line. Via 285A is located between, physically contacts, and connects word line landing pad 280D to word line 290A, and via 285B is located between, physically contacts, and connects word line landing pad 280E to word line 290A. With such configuration, the gate of pass-gate transistor PG-1 is electrically connected to word line 290A by gate via 260A, word line landing pad 280D, and via 285A, and the gate of pass-gate transistor PG-2 is electrically connected to word line 290A by gate via 260B, word line landing pad 280E, and via 285B. Via 285C is located between, physically contacts, and $1^{st}$ $V_{SS}$ landing pad 280F to $1^{st}$ $V_{SS}$ landing pad 290B, and via 285D is located between, physically contacts, and connects $2^{nd}$ $V_{SS}$ landing pad 280G to $2^{nd}$ $V_{SS}$ landing pad 290C.

V2 layer includes conductive features, such as vias 295A-295C, that connect M2 layer to conductive features of M3 layer, such as a $1^{st}$ $V_{SS}$ line 300A, a $2^{nd}$ $V_{SS}$ line 300B, and a word line landing pad 300C (WL LP3). V3 layer includes conductive features, such as via 305, that connect M3 layer to conductive features of M4 layer, such as a $2^{nd}$ word line 310. Via 295A is located between, physically contacts, and connects $1^{st}$ $V_{SS}$ landing pad 290B to $1^{st}$ $V_{SS}$ line 300A, and via 295B is located between, physically contacts, and connects $2^{nd}$ $V_{SS}$ landing pad 290C to $2^{nd}$ $V_{SS}$ line 300B. With such configuration, the source of pull-down transistor PD-1 is electrically connected to $1^{st}$ $V_{SS}$ line 300A by source/drain contact 250C, source/drain via 270B, $1^{st}$ $V_{SS}$ landing pad 280F, via 285A, $1^{st}$ $V_{SS}$ landing pad 290B, and via 295A, and the source of pull-down transistor PD-2 is electrically connected to $2^{nd}$ $V_{SS}$ line 300B by source/drain contact 250F, source/drain via 270E, $2^{nd}$ $V_{SS}$ landing pad 280G, via 285D, $2^{nd}$ $V_{SS}$ landing pad 290C, and via 295B, such that the source of pull-down transistor PD-1 and the source of pull-down transistor PD-2 are both electrically connected to a ground voltage and/or a reference voltage, such as $V_{SS}$. Via 295C is located between, physically contacts, and connects $1^{st}$ word line 290A to word line landing pad 300C, and via 305 is located between, physically contacts, and connects word line landing pad 300C to $2^{nd}$ word line 310. With such configuration, $1^{st}$ word line 290A is electrically connected to $2^{nd}$ word line 310 by via 295C, word line landing pad 300C, and via 305, such that the gate of pass-gate transistor PG-1 and the gate of pass-gate transistor PG-2 are electrically connected to both $1^{st}$ word line 290A and $2^{nd}$ word line 310.

In SRAM cell 200, metal lines of odd-numbered metal layers (i.e., M1 layer and M3 layer) are routed along the y-direction (i.e., the second routing direction) and metal lines of even-numbered metal layers (i.e., M2 layer and M4 layer) are routed along the x-direction (i.e., the first routing direction). For example, bit line 280A, bit line bar 280B, $V_{DD}$ line 280C, word line landing pad 280D, word line landing pad 280E, $1^{st}$ $V_{SS}$ landing pad 280F, and $2^{nd}$ $V_{SS}$ landing pad 280G have longitudinal directions substantially along the y-direction; $1^{st}$ word line 290A, $1^{st}$ $V_{SS}$ landing pad 290B, and $2^{nd}$ $V_{SS}$ landing pad 290C have longitudinal directions substantially along the x-direction; $1^{st}$ $V_{SS}$ line 300A, $2^{nd}$ $V_{SS}$ line 300B, and word line landing pad 300C have longitudinal directions substantially along the y-direction; and $2^{nd}$ word line 310 has a longitudinal direction substantially along the x-direction. In other words, a longest dimension (e.g., length) of bit line 280A, bit line bar 280B, $V_{DD}$ line 280C, word line landing pad 280D, word line landing pad 280E, $1^{st}$ $V_{SS}$ landing pad 280F, $2^{nd}$ $V_{SS}$ landing pad 280G, $1^{st}$ $V_{SS}$ line 300A, $2^{nd}$ $V_{SS}$ line 300B, and word line landing pad 300C is along the y-direction, and a longest dimension of $1^{st}$ word line 290A, $1^{st}$ $V_{SS}$ landing pad 290B, $2^{nd}$ $V_{SS}$ landing pad 290C, and $2^{nd}$ word line 310 is along the x-direction. Metal lines of M1 layer, M2 layer, M3 layer, and M4 layer are substantially rectangular-shaped (i.e., each has a length greater than its width), but the present disclosure contemplates metal lines of M1 layer, M2 layer, M3 layer, and/or M4 layer having different shapes and/or combinations of shapes to optimize and/or improve performance (e.g., reduce resistance) and/or layout footprint (e.g., reduce density).

"Landing pad" generally refers to metal lines in metal layers that provide intermediate, local interconnection for SRAM cell 200, such as (1) an intermediate, local interconnection between a device-level feature (e.g., gate or source/drain) and a bit line (e.g., bit line 280A and/or bit line bar 280B), a word line (e.g., $1^{st}$ word line 290A and/or $2^{nd}$ word line 310), or a voltage line (e.g., $V_{DD}$ line 280C, $1^{st}$ $V_{SS}$ line 300A, and/or $2^{nd}$ $V_{SS}$ line 300B) of SRAM cell 200 or (2) an intermediate, local interconnection between bit lines, word lines, or voltage lines. For example, $1^{st}$ word line 290A in M2 layer is connected to gates of pass-gate transistors PG-1, PG-2 in device layer DL by word line landing pad 280D (in M1 layer) and word line landing pad 280E (in M1 layer), respectively; $1^{st}$ $V_{SS}$ line 300A in M3 layer is connected to source of pull-down transistor PD-1 in device layer DL by $1^{st}$ $V_{SS}$ landing pad 290B (in M2 layer) and $1^{st}$ $V_{SS}$ landing pad 280F (in M1 layer); $2^{nd}$ $V_{SS}$ line 300B in M3 layer is connected to source of pull-down transistor PD-2 in device layer DL by $2^{nd}$ $V_{SS}$ landing pad 290C (in M2 layer) and $2^{nd}$ $V_{SS}$ landing pad 280G (in M1 layer); and $2^{nd}$ word line 310 in M4 layer is connected to $1^{st}$ word line 290A in M2 layer by word line landing pad 300C (in M3 layer). Landing pads of SRAM cell 200 have longitudinal dimensions that are large enough to provide a sufficient landing area for their overlying vias (and thus minimize overlay issues and provide greater patterning flexibility) and less than longitudinal dimensions of bit lines, word lines, and/or voltage lines of SRAM cell 200. In the depicted embodiment, landing pads of SRAM cell 200 have dimensions that are less than dimensions of SRAM cell 200, such as dimensions along the x-direction that are less than cell width W and dimensions along the y-direction that are less than cell height H, while bit lines, word line, and voltage lines of SRAM cell 200 have dimensions that are greater than dimensions of SRAM cell 200, such as dimensions along the x-direction that are greater than cell width W and/or dimensions along the y-direction that are greater than cell height H. For example, in M1 layer, bit line 280A, bit line 280B, and $V_{DD}$ line 280C have lengths along the y-direction that are greater than cell height H, while word line landing pad 280D, word line landing pad 280E, $1^{st}$ $V_{SS}$ landing pad 280F, and $2^{nd}$ $V_{SS}$ landing pad 280G have lengths along the y-direction that are less than cell height H. In another example, in M2 layer, $1^{st}$ word line 290A has a length along the x-direction that is greater than cell width W, while $1^{st}$ $V_{SS}$ landing pad 290B, and $2^{nd}$ $V_{SS}$ landing pad 290C have lengths along the x-direction that are less than cell width W. In yet another example, in M3 layer, $1^{st}$ $V_{SS}$ line 300A and $2^{nd}$ $V_{SS}$ line 300B have lengths along the y-direction that are greater than cell height H, while word line landing pad 300C has a length along the y-direction that is less than cell height H. In some embodiments, a length of bit line 280A and/or a length of bit line bar 280B is sufficient to allow electrical connection of multiple SRAM cells in a column to bit line 280A and/or bit line bar 280B. In some embodiments, a length of $V_{DD}$ line 280C is sufficient to allow electrical connection of multiple SRAM cells in a column to $V_{DD}$ line 280C. In some embodiments, a length of $1^{st}$ word line 290A and/or a length of $2^{nd}$ word line 310 is sufficient to allow electrical connection of multiple SRAM cells in a row to $1^{st}$ word line 290A and/or $2^{nd}$ word line 310. In some embodiments, a length of $1^{st}$ $V_{SS}$ line 300A and/or a length of $2^{nd}$ $V_{SS}$ line 300B is sufficient to allow electrical connection of multiple SRAM cells in a column to $1^{st}$ $V_{SS}$ line 300A and/or $2^{nd}$ $V_{SS}$ line 300B.

Bit line capacitance and/or bit line resistance have become significant factors in SRAM performance as SRAM cell sizes shrink to achieve SRAM cells with faster operating speeds (e.g., by reducing distances traveled by electrical signals) at scaled IC technology nodes, such as 20 nm node to 10 nm node to 3 nm node and below. For example, shrinking SRAM cell size should lead to decreasing resistance-capacitance (RC) delay, which generally indicates delay in electrical signal speed through an IC resulting from a product of resistance (R) (i.e., a material's opposition to flow of electrical current) and capacitance (C) (i.e., a material's ability to store electrical charge). However, bit line capacitance and/or bit line resistance have been observed to increase as bit line dimensions and/or bit line spacings decrease with shrinking SRAM cell sizes (and increasing SRAM cell density), thereby undesirably increasing RC delay and decreasing SRAM speed, such as write/read speed. Tradeoffs between bit line capacitance and bit line resistance must thus be considered to optimize SRAM performance. For example, since bit line capacitance increases as a number of interconnections (e.g., contacts, vias, and/or metal lines) between a bit line and a device layer increases and routing density typically increases as metallization level of the MLI feature decreases (i.e., a routing density of M1 layer is greater than a routing density of M2 layer or a routing density of M3 layer), a bit line placed in a lowest metallization level of an MLI feature (i.e., M1 layer) may decrease bit line capacitance but increase bit line resistance (for example, by needing only one via to connect the bit line and a drain of a pass-gate transistor, but needing a narrower and/or thinner bit line to meet higher routing specifications), while a bit line placed in a higher metallization level of the MLI feature (e.g., M2 layer or M3 layer) may increase bit line capacitance but decrease bit line resistance (for example, by needing more than one via and at least one landing pad to connect the bit line and a drain of a pass-gate transistor, but allowing for a wider and/or a thicker bit line to meet routing density specifications that are lower than routing density specifications of M1 layer).

SRAM cell 200 addresses these challenges by placing bit lines (here, bit line 280A and bit line bar 280B) in M1 layer, which is a lowest metallization level of an MLI feature over substrate 202, to minimize bit line capacitance, and configuring bit lines as the widest metal lines of M1 layer to minimize bit line resistance. For example, bit line 280A and bit line bar 280B each have a width W1, $V_{DD}$ line 280C has a width W2, word line landing pad 280D and word line landing pad 280E each have a width W3, and $1^{st}$ $V_{SS}$ landing pad 280F and $2^{nd}$ $V_{SS}$ landing pad 280G each have a width W4, where width W1 is a widest, greatest width of the metal lines in M1 layer and width W2, width W3, and width W4 are each less than width W1. In some embodiments, a ratio of width W1 to width W2 (i.e., W1:W2) is about 1.1 to about 2, a ratio of width W1 to width W3 (i.e., W1:W3) is about 1.1 to about 2, and/or a ratio of width W1 to width W4 (i.e., W1:W4) is about 1.1 to about 2. A width ratio for bit lines/other M1 lines that is less than about 1.1 may not provide bit lines with sufficient widths for reducing bit line resistance, thereby degrading SRAM performance, such as write capability (e.g., higher bit line resistances induces worse (i.e., greater) bit line IR drops), while a width ratio for bit lines/other M1 lines that is greater than about 2 may provide bit lines with widths that increase bit line resistance (i.e., bit lines are too wide) and/or may impact cell size (i.e., larger cell sizes may be needed to account for larger width ratios), both of which can degrade SRAM performance, such as read speed. In some embodiments, a ratio of width W1 to width W2 is about 1.1 to about 1.4, a ratio of width W1 to width W3 is about 1.1 to about 1.4, and/or a ratio of width W1 to width W4 (i.e., W1:W4) is about 1.1 to about 1.4 to optimize SRAM performance. In furtherance of the depicted embodiment, $V_{DD}$ line 280C has a smallest width of the metal lines in M1 layer of SRAM cell 200 (i.e., width W2 is also less than width W3 and width W4). In some embodiments, width W2 is greater than width W3 and/or width W4. In some embodiments, width W2 is substantially the same as width W3 and/or width W4. Width W3 is greater than, less than, or substantially the same as width W4. In some embodiments, word line landing pad 280D and word line landing pad 280E have different widths. In some embodiments, $1^{st}$ $V_{SS}$ landing pad 280F and $2^{nd}$ $V_{SS}$ landing pad 280G have different widths.

Reducing bit line capacitance by placing bit line 280A and bit line bar 280B in M1 layer while reducing bit line resistance by configuring bit line 280A and bit line bar 280B as the widest metal lines of M1 layer provides SRAM cell 200 with optimized electrical characteristics and SRAM cell density compared to conventional SRAM cells. In some embodiments, bit line resistance reduction provided by configuring bit line 280A and/or bit line bar 280B as the widest metal lines of M1 layer reduces bit line IR drop (i.e., a voltage drop across a bit line as current flows through the bit line), which increases SRAM read/write speed and/or reduces a minimum operating voltage ($V_{min}$) needed for SRAM read/write. For example, during a write, such as that used to write a logical 0 to storage node SN, pass-gate transistor PG-1 needs to dominate over pull-up transistor PU-1 to sink a voltage on bit line BL (0), rather than staying at power supply voltage $V_{DD}$. A bit line with a large IR drop lowers a driving ability of pass-gate transistor PG-1 and thereby necessitates higher minimum operating voltages. In contrast, because bit line 280A and/or bit line bar 280B are placed and configured within SRAM cell 200 to exhibit minimum resistance, bit line 280A and/or bit line bar 280B exhibit lower IR drops than those observed in bit lines of conventional SRAM cells, thereby improving SRAM performance.

Vias of SRAM cell 200, such as gate via 260A, gate via 260B, source/drain vias 270A-270F, vias 285A-285D, vias 295A-295C, and via 305, are substantially square-shaped and/or circle-shaped (i.e., each has a dimension along the x-direction that is substantially the same as a dimension along the y-direction). Vias of SRAM cell 200 can have different dimensions, different shapes, and/or combinations of dimensions and/or shapes to optimize and/or improve performance (e.g., reduce resistance) and/or layout footprint (e.g., reduce density and/or size of SRAM cell 200). In the depicted embodiment, source/drain vias corresponding with $V_{SS}$ lines of SRAM cell 200, such as source/drain via 270B and source/drain via 270E, are substantially rectangular-shaped and/or oval-shaped (i.e., each has a dimension D1 along the x-direction that is different than a dimension D2 along the y-direction) to reduce contact resistance associated with interconnection structures from sources of pull-down transistors PD-1, PD-2 to M1 layer (i.e., source/drain contact 250C and source/drain via 270B connecting epitaxial source/drain feature 230C to $1^{st}$ $V_{SS}$ landing pad 280F and source/drain contact 250F and source/drain via 270E connecting epitaxial source/drain feature 230H to $2^{nd}$ $V_{SS}$ landing pad 280G). Such source/drain vias can also be referred to as slot-shaped vias. In some embodiments, a ratio of dimension D1 to dimension D2 (i.e., D1:D2) is about 1.5 to about 3. A longest dimension/shortest dimension ratio for source/drain vias corresponding with $V_{SS}$ lines that is less than about 1.5 provides source/drain vias with circular shapes or circular-like shapes, which can increase resistance and/or negatively impact critical dimension accuracy. A longest dimension/shortest dimension ratio for source/drain vias corresponding with $V_{SS}$ lines that is greater than about 3 can negatively impact bit line width. For example, as dimension D1 increases to provide longest dimension/shortest dimension ratios for source/drain vias 270B, 270E that are greater than about 3, source/drain vias 270B, 270E will begin to extend into and overlap bit line areas/regions of M1 layer, such as areas/regions where bit line 280A and bit line bar 280B are located within M1 layer. Bit line widths (e.g., width W1) will thus be undesirably reduced to accommodate longest dimension/shortest dimension ratios greater than about 3, for example, to prevent undesired electrical connection of source/drain via 270B and bit line 280A and/or source/drain via 270E and bit line bar 280B. Further, widths of M1 landing pads, such as width W4 of $1^{st}$ $V_{SS}$ landing pad 280F and $2^{nd}$ $V_{SS}$ landing pad 280G, may be increased to ensure proper electrical connection of the M1 landing pads and source/drain vias 270B, 270E or improve overlay of the M1 landing pads and source/drain vias 270B, 270E when longest dimension/shortest dimension ratios are greater than about 3, which may also necessitate undesirable reduction of bit line widths. Longest dimension/shortest dimension ratios for source/drain vias that are less than about 3 thus minimizes source/drain via resistance while accommodating for bit line widths, such as disclosed herein, that maximize bit line resistance reduction. In some embodiments, source/drain contacts corresponding with $V_{SS}$ lines of SRAM cell 200, such as source/drain contact 250C and source/drain contact 250F, are also configured with a ratio of a length to a width that can further reduce contact resistance associated with the interconnection structures from sources of pull-down transistors PD-1, PD-2 to M1 layer. For example, the ratio of the length along the x-direction of source/drain contact 250C and/or source/drain contact 250F to a width along the y-direction of source/drain contact 250C and/or source/drain contact 250F (i.e., L/W) is greater than about 3. In some embodiments, adjacent SRAM cells may share interconnections with $V_{SS}$ lines, such as source/drain contacts (e.g., source/drain contacts 250C, 250F and/or source/drain vias 270B, 270E corresponding with $V_{SS}$ lines. In such embodiments, a length/width ratio for source/drain contacts corresponding with $V_{SS}$ lines that is less than about 3 may not extend to cell boundary MC, which is shared with adjacent SRAM cells. In some embodiments, a length/width ratio for source/drain contacts corresponding with $V_{SS}$ lines that is greater than about 3 can ensure that source/drain contacts 250C, 250F extend beyond cell boundary MC into adjacent SRAM cells.

The present disclosure contemplates various placements of vias and metal lines of SRAM cell 200. In the depicted embodiment, bit line 280A, bit line bar 280B, and $V_{DD}$ line 280C in M1 layer span cell height H and overlap and extend beyond the upper edge and the lower edge of cell boundary MC; $1^{st}$ word line 290B in M2 layer spans cell width W and overlaps and extends beyond the left edge and the right edge of cell boundary MC; $1^{st}$ $V_{SS}$ line 300A and $2^{nd}$ $V_{SS}$ line 300B in M3 layer span cell height H and overlap and extend beyond the upper edge and the lower edge of cell boundary MC; and $2^{nd}$ word line 310 in M4 layer spans cell width W and overlaps and extends beyond the left edge and the right edge of cell boundary MC. In such embodiments, bit line 280A, bit line bar 280B, $V_{DD}$ line 280C, $1^{st}$ $V_{SS}$ line 300A, and $2^{nd}$ $V_{SS}$ line 300B may overlap three memory cells, such as SRAM cell 200, an SRAM cell directly above and adjacent to SRAM cell 200, and an SRAM cell directly below and adjacent to SRAM cell 200. In such embodiments, $1^{st}$ word line 290B and $2^{nd}$ word line 310 may overlap three memory cells, such as SRAM cell 200, an SRAM cell directly left and adjacent to SRAM cell 200, and an SRAM cell directly right and adjacent to SRAM cell 200. In furtherance of the depicted embodiment, source/drain via 270A, source/drain via 270C, source/drain via 270E, $2^{nd}$ $V_{SS}$ landing pad 280G, via 285D, $2^{nd}$ $V_{SS}$ landing pad 290C, and via 295B overlap the upper edge of cell boundary MC; source/drain via 270B, source/drain via 270D, source/drain via 270F, $1^{st}$ $V_{SS}$ landing pad 280F, via 285C, $1^{st}$ $V_{SS}$ landing pad 290B, and via 295A overlap the lower edge of cell boundary MC; gate via 260A, source/drain via 270B, word line landing pad 280D, $1^{st}$ $V_{SS}$ landing pad 280F, via 285A, $1^{st}$ $V_{SS}$ landing pad 290B, and via 295A overlap the left edge of cell boundary MC; and gate via 260B, source/drain via 270E, word line landing pad 280E, $2^{nd}$ $V_{SS}$ landing pad 280G, via 285B, $2^{nd}$ $V_{SS}$ landing pad 290C, and via 295B overlap a right edge of cell boundary MC. In such embodiments, source/drain via 270A and source/drain via 270C may overlap two memory cells, such as SRAM cell 200 and an SRAM cell directly above and adjacent to SRAM cell 200; source/drain via 270D and source/drain via 270F may overlap two memory cells, such as SRAM cell 200 and an SRAM cell directly below and adjacent to SRAM cell 200; gate via 260A, word line landing pad 280D, and via 285A may overlap two memory cells, such as SRAM cell 200 and an SRAM cell directly left and adjacent to SRAM cell 200; and gate via 260B, word line landing pad 280E, and via 285B may overlap two memory cells, such as SRAM cell 200 and an SRAM cell directly right and adjacent to SRAM cell 200. In such embodiments, source/drain via 270E, $2^{nd}$ $V_{SS}$ landing pad 280G, via 285D, $2^{nd}$ $V_{SS}$ landing pad 290C, and via 295B may overlap four memory cells, such as SRAM cell 200, an SRAM cell directly right and adjacent to SRAM cell 200, an SRAM cell directly above and adjacent to SRAM cell 200, and an SRAM cell directly diagonal and adjacent to SRAM cell 200 (e.g., an SRAM cell that shares a cell boundary with the directly right SRAM cell and the directly above SRAM cell). In such embodiments, source/drain via 270B, $1^{st}$ $V_{SS}$ landing pad 280F, via 285C, $1^{st}$ $V_{SS}$ landing pad 290B, and via 295A may overlap four memory cells, such as SRAM cell 200, an SRAM cell directly left and adjacent to SRAM cell 200, an SRAM cell directly below and adjacent to SRAM cell 200, and an SRAM cell directly diagonal and adjacent to SRAM cell 200 (e.g., an SRAM cell that shares a cell boundary with the directly left SRAM cell and the directly below SRAM cell).

Configuring SRAM cell 200 with a double word line structure (i.e., $1^{st}$ word line 290A in M2 layer and $2^{nd}$ word line 310 in M4 layer, both of which are electrically connected to pass-gate transistor PG-1 and pass-gate transistor PG-2) can further optimize SRAM performance by reducing word line resistance compared to a single word line structure. In some embodiments, it has been observed that two parallel and electrically connected together metal, word lines can reduce word line resistance at least 50%. For example, if resistance of $1^{st}$ word line 290A in M2 layer is provided by 1× and resistance of $2^{nd}$ word line 310 in M4 layer is provided by 0.8×, stacking and connecting $1^{st}$ word line 290A in M2 layer and $2^{nd}$ word line 310 in M4 layer to provide the double word line structure can provide an equivalent word line resistance that is about 0.444× (e.g., $1/(1/1+1/0.8)\times \approx 0.444\times$). An interconnection structure between $1^{st}$ word line 290A and $2^{nd}$ word line 310 (here, formed by via 295C, word line landing pad 300C, and via 305) is referred to hereinafter as a word line strap, a word line strap module, and/or a word line pick-up region. In the depicted embodiment, SRAM cell 200 includes a single word line strap in a central region of SRAM cell 200 above $V_{DD}$ line 280C. In some embodiments, SRAM cell 200 includes multiple word line straps connecting $1^{st}$ word line 290A and $2^{nd}$ word line 310. In some embodiments, the word line strap is not located in SRAM cell 200 but is instead located in an SRAM cell with which SRAM cell 200 shares the double word line structure. For example, where SRAM cell 200 is incorporated into a memory array having SRAM cells arranged in rows and columns, the word line strap may be located in an SRAM cell in a same row as SRAM cell 200. Such is depicted in FIG. 7, which is a fragmentary diagrammatic plan view of an SRAM-based memory 400 having a double word line structure according to various aspects of the present disclosure. For clarity and simplicity, similar features of memory 100 in FIG. 1 and memory 400 in FIG. 7 are identified by the same reference numerals. In FIG. 7, memory array 12 is a 4×8 SRAM array (i.e., four columns, eight rows), where each row has four SRAM cells 200 between a pair of edge cells 30 and each column has eight SRAM cells 200 between a pair of edge cells 30. Each row of SRAM cells 200 shares a $1^{st}$ word line, such as $1^{st}$ word line 290A at M2 layer, and a $2^{nd}$ word line, such as $2^{nd}$ word line 310 at M4 layer, where each row has a word line strap located in at least one SRAM cell 200 (i.e., bit cell) of the row and a word line strap located in at least one edge cell 30 of the row. For example, each of rows R1-R8 has a respective word line strap 410A located in one of its SRAM cells 200 (i.e., four SRAM cells 200 in a row share a $1^{st}$ word line, a $2^{nd}$ word line, and a respective word line strap 410A) and a respective word line strap 410B located in one of its edge cells 30. In the depicted embodiment, each of rows R1-R8 has respective word lines straps 410B located in both respective edge cells 30. In embodiments where each row has more than four SRAM cells 200, a word line strap can be formed and shared by every four SRAM cells in a row, every eight SRAM cells in a row, or other number of SRAM cells in a row. In some embodiments, word line straps 410A are arranged in different columns. In some embodiments, word line straps 410A are arranged in the same columns. In FIG. 7, column C1 has one word line strap 410A, column C2 has two word line straps 410A, column C3 has three word line straps 410A, and column C4 has two word line straps 410A, where word lines straps 410A are not located in directly adjacent SRAM cells 200 along the y-direction. Any configuration of word line straps 410A in memory array 12 is contemplated by the present disclosure. FIG. 7 has been simplified for the sake of clarity to better understand the inventive concepts of the present disclosure. Additional features can be added in memory 400, and some of the features described above can be replaced, modified, or eliminated in other embodiments of memory 400.

Configuring SRAM cell 200 with a double $V_{SS}$ line structure can further optimize SRAM performance by reducing $V_{SS}$ line resistance compared to a single $V_{SS}$ line structure. In some embodiments, similar to the double word line structure, it has been observed that two parallel and electrically connected together metal, $V_{SS}$ lines can reduce $V_{SS}$ line resistance at least 50%. FIGS. 8A-8C are various top, plan views of various layers of an SRAM-based memory having a double $V_{SS}$ line structure according to various aspects of the present disclosure. For example, FIG. 8A is a top, plan view of conductive features in M2 layer, V2 layer, M3 layer, V3 layer, and M4 layer (e.g., M2/V2/M3/V3/M4), in portion or entirety, of the SRAM-based memory according to various aspects of the present disclosure; FIG. 8B is a top, plan view of conductive features in M2 layer, V2 layer, and M3 layer (e.g., M2/V2/M3), in portion or entirety, of the SRAM-based memory according to various aspects of the present disclosure; and FIG. 8C is a top, plan view of conductive features in M3 layer, V3 layer, and M4 layer (e.g., M3/V3/M4), in portion or entirety, of the SRAM-based memory according to various aspects of the present disclosure. FIGS. 8A-8C have been simplified for the sake of clarity to better understand the inventive concepts of the present disclosure. Additional features can be added in the SRAM-based memory, and some of the features described below can be replaced, modified, or eliminated in other embodiments of the SRAM-based memory.

In FIG. 8A-8C, SRAM cell 200 is a portion of a memory array that further includes an SRAM cell 200-1, an SRAM cell 200-2, an SRAM cell 200-3, an SRAM cell 200-4, an SRAM cell 200-5, an SRAM cell 200-6, and an SRAM cell 200-7, each of which can be configured similar to SRAM cell 200. Two directly adjacent columns (e.g., a column N and a column N+1, where N is a number of a column within the memory array) and four directly adjacent rows (e.g., a row M, a row M+1, a row M+2, and a row M+3, where M is a number of a row within the memory array) of the memory array are depicted, where SRAM cell 200 is at row M, column N. M2 layer includes $1^{st}$ word line 290A of SRAM cell 200, which extends continuously along row M, such that $1^{st}$ word line 290A is shared by SRAM cell 200 and SRAM cell 200-4; a $1^{st}$ word line 290D that extends continuously along row M+1, such that $1^{st}$ word line 290D is shared by SRAM cell 200-1 and SRAM cell 200-5; a $1^{st}$ word line 290E that extends continuously along row M+2, such that $1^{st}$ word line 290E is shared by SRAM cell 200-2 and SRAM cell 200-6; and a $1^{st}$ word line 290F that extends continuously along row M+3, such that $1^{st}$ word line 290F is shared by SRAM cell 200-3 and SRAM cell 200-7. With such configuration, each SRAM cell of the memory array has a respective $1^{st}$ word line (e.g., $1^{st}$ word line 290A, $1^{st}$ word line 290D, $1^{st}$ word line 290E, or $1^{st}$ word line 290F) electrically connected to a gate of a respective pull-down transistor PD-1 and a gate of a respective pull-down transistor PD-2 by a respective $1^{st}$ word line interconnect structure underlying M2 layer, which includes a gate via in V0 layer, a word line landing pad in M1 layer, and a via in V1 layer.

M3 layer includes $1^{st}$ $V_{SS}$ line 300A of SRAM cell 200, which extends continuously along the y-direction, such that $1^{st}$ $V_{SS}$ line 300A is shared by SRAM cells of column N (here, SRAM cell 200, SRAM cell 200-1, SRAM cell 200-2, and SRAM cell 200-3); $2^{nd}$ $V_{SS}$ line 300B of SRAM cell 200, which extends continuously along the y-direction, such that $2^{nd}$ $V_{SS}$ line 300B is shared by SRAM cells of column N and SRAM cells of column N+1 (here, SRAM cell 200-4, SRAM cell 200-5, SRAM cell 200-6, and SRAM cell 200-7; and $1^{st}$ $V_{SS}$ line 300D, which extends continuously along the y-direction, such that $1^{st}$ $V_{SS}$ line 300D is shared by SRAM cells of column N+1. $2^{nd}$ $V_{SS}$ line 300B overlaps an interface between cell boundaries of SRAM cells in column N and cell boundaries of SRAM cells in column N+1. With such configuration, each SRAM cell of the memory array has a respective $1^{st}$ $V_{SS}$ line (e.g., $1^{st}$ $V_{SS}$ line 300A or $1^{st}$ $V_{SS}$ line 300D) and a respective $2^{nd}$ $V_{SS}$ line (e.g., $2^{nd}$ $V_{SS}$ line 300B) electrically connected to a source of a respective pull-down transistor PD-1 and a source of a respective pull-down transistor PD-2, respectively, by $V_{SS}$ interconnect structures underlying M3 layer, each of which includes a source/drain contact in C0 layer, a source/drain via in V0 layer, a first $V_{SS}$ landing pad in M1 layer, a via in V1 layer, a second $V_{SS}$ landing pad in M2 layer, and a via in V2 layer. In FIG. 8A-8C, portions of the $V_{SS}$ interconnect structures in M2 layer through V2 layer are depicted, such as a $1^{st}$ $V_{SS}$ interconnect structure shared by SRAM cell 200 and SRAM cell 200-1 that includes $1^{st}$ $V_{SS}$ landing pad 290B ($1^{st}$ $V_{SS}$ LP2) and via 295A, a $2^{nd}$ $V_{SS}$ interconnect structure shared by SRAM cell 200 and SRAM cell 200-4 that includes $2^{nd}$ $V_{SS}$ landing pad 290C ($2^{nd}$ $V_{SS}$ LP2) and via 295B, a $1^{st}$ $V_{SS}$ interconnect structure shared by SRAM cell 200-2 and SRAM cell 200-3 that includes a $1^{st}$ $V_{SS}$ landing pad 290G ($1^{st}$ $V_{SS}$ LP2) and a via 295D, a $2^{nd}$ $V_{SS}$ interconnect structure shared by SRAM cell 200-3 and SRAM cell 200-7 that includes a $2^{nd}$ $V_{SS}$ landing pad 290H ($2^{nd}$ $V_{SS}$ LP2) and a via 295E, a $1^{st}$ $V_{SS}$ interconnect structure shared by SRAM cell 200-4 and SRAM cell 200-5 that includes a $1^{st}$ $V_{SS}$ landing pad 290I ($1^{st}$ $V_{SS}$ LP2) and a via 295F, a $2^{nd}$ $V_{SS}$ interconnect structure shared by SRAM cell 200-5 and SRAM cell 200-6 that includes a $2^{nd}$ $V_{SS}$ landing pad 290J ($2^{nd}$ $V_{SS}$ LP2) and a via 295G, and a $1^{st}$ $V_{SS}$ interconnect structure shared by SRAM cell 200-6 and SRAM cell 200-7 that includes a $1^{st}$ $V_{SS}$ landing pad 290K ($1^{st}$ $V_{SS}$ LP2) and a via 295H.

M4 layer includes $2^{nd}$ word line 310 of SRAM cell 200, which extends continuously along row M, such that $2^{nd}$ word line 310 is shared by SRAM cell 200 and SRAM cell 200-4; a $2^{nd}$ word line 310A that extends continuously along row M+1, such that $2^{nd}$ word line 310A is shared by SRAM cell 200-1 and SRAM cell 200-5; a $2^{nd}$ word line 310B that extends continuously along row M+2, such that $2^{nd}$ word line 310B is shared by SRAM cell 200-2 and SRAM cell 200-6; and a $2^{nd}$ word line 310C that extends continuously along row M+3, such that $2^{nd}$ word line 310C is shared by SRAM cell 200-3 and SRAM cell 200-7. With such configuration, each SRAM cell of the memory array has a respective $2^{nd}$ word line (e.g., $2^{nd}$ word line 310, $2^{nd}$ word line 310A, $2^{nd}$ word line 310B, or $2^{nd}$ word line 310C) electrically connected to a respective $1^{st}$ word line (e.g., $1^{st}$ word line 290A, $1^{st}$ word line 290D, $1^{st}$ word line 290E, or $1^{st}$ word line 290F) by word line straps between M2 layer and M4 layer, each of which includes a via in V2 layer, a word line landing pad in M3 layer, and a via in V3 layer. In FIGS. 8A-8C, a word line strap is shared by SRAM cell 200 and SRAM cell 200-4 that includes via 295C, word line landing pad 300C, and via 305; a word line strap is shared by SRAM cell 200-1 and SRAM cell 200-5 that includes a via 295I, a word line landing pad 300E, and a via 305A; a word line strap is shared by SRAM cell 200-2 and SRAM cell 200-6 that includes a via 295J, a word line landing pad 300F, and a via 305B; and a word line strap is shared by SRAM cell 200-3 and SRAM cell 200-7 that includes a via 295K, a word line landing pad 300G, and a via 305C. Word line landing pad 300E, word line landing pad 300F, and word line landing pad 300G form a portion of M3 layer. Via 305A, via 305B, and via 305C form a portion of V3 layer.

To provide the memory with a power mesh, each SRAM cell further has a $3^{rd}$ $V_{SS}$ line in M4 layer that is electrically connected to its respective $1^{st}$ $V_{SS}$ line and its respective $2^{nd}$ $V_{SS}$ line. For example, M4 layer includes a $3^{rd}$ $V_{SS}$ line 320 electrically connected to $1^{st}$ $V_{SS}$ line 300A by a $V_{SS}$ well strap (here, a via 305D), $1^{st}$ $V_{SS}$ line 300D by a $V_{SS}$ well strap (here, a via 305E), and $2^{nd}$ $V_{SS}$ line 300B by a $V_{SS}$ well strap (here, a via 305F). Via 305D, via 305E, and via 305F form a portion of V3 layer. Interconnecting $V_{SS}$ lines in M3 layer (e.g., $1^{st}$ $V_{SS}$ line 300A, $2^{nd}$ $V_{SS}$ line 300B, and $1^{st}$ $V_{SS}$ line 300D) to a $V_{SS}$ line in M4 layer (e.g., $3^{rd}$ $V_{SS}$ line 320) with vias 305D-305E provides a double $V_{SS}$ line structure (also referred to as a power mesh) that can reduce $V_{SS}$ line resistance. $3^{rd}$ $V_{SS}$ line 320 is routed and extends continuously along the x-direction (i.e., the first routing direction), such that $3^{rd}$ $V_{SS}$ line 320 has a longitudinal direction substantially along the x-direction (and substantially parallel with $2^{nd}$ word lines of M4 layer). In the depicted embodiment, $3^{rd}$ $V_{SS}$ line 320 overlaps an interface between cell boundaries of SRAM cells in row M+1 and cell boundaries of SRAM cells in row M+2, and is shared by eight SRAM cells (i.e., SRAM cell 200, SRAM cell 200-1, SRAM cell 200-2, SRAM cell 200-3, SRAM cell 200-4, SRAM cell 200-5, SRAM cell 200-6, and SRAM cell 200-7). In furtherance of the depicted embodiment, $3^{rd}$ $V_{SS}$ line 320 is located between $2^{nd}$ word line 310A and $2^{nd}$ word line 310B, such that $3^{rd}$ $V_{SS}$ line 320 is arranged between every two $2^{nd}$ word lines. In some embodiments, a $3^{rd}$ $V_{SS}$ line is placed between every pair of $2^{nd}$ word lines, every two $2^{nd}$ word lines, every four $2^{nd}$ word lines, every eight $2^{nd}$ word lines, or other number of $2^{nd}$ word lines. In some embodiments, four SRAM cells in a column (e.g., column N or column N+1) share a $3^{rd}$ $V_{SS}$ line. In some embodiments, two SRAM cells in a column share a $3^{rd}$ $V_{SS}$ line. In some embodiments, another number of SRAM cells in a column share a $3^{rd}$ $V_{SS}$ line. In the depicted embodiment, a width of $3^{rd}$ $V_{SS}$ line 320 is less than widths of $2^{nd}$ word lines. In some embodiments, the width of $3^{rd}$ $V_{SS}$ line 320 is the narrowest of metal lines in M4 layer. In some embodiments, a width of $3^{rd}$ $V_{SS}$ line 320 is greater than widths of $2^{nd}$ word lines.

In some embodiments, SRAM cell 200 is fabricated on a same wafer as a logic cell (often referred to as a standard cell). In such embodiments, M1 layer of SRAM cell 200 and M1 layer of the logic cell can be configured to optimize both SRAM performance and logic density (co-optimization). For example, FIG. 9A is a top, plan view of conductive features in M1 layer of SRAM cell 200 and a cross-sectional view of the conductive features in M1 layer of SRAM cell 200 along line A-A of FIG. 9A, in portion or entirety, according to various aspects of the present disclosure; and FIG. 9B is a top, plan view of conductive features in a M1 layer of a logic cell and a cross-sectional view of the conductive features in M1 layer of the logic cell along line A-A of FIG. 9B, in portion or entirety, according to various aspects of the present disclosure. The logic cell has a cell boundary LC, which has a first dimension, such as a cell width CW, along a first direction (e.g., x-pitch along an x-direction) and a second dimension, such as a cell height CH, along a second direction (e.g., y-pitch along a y-direction). In some embodiments, such as depicted, cell width CW is less than cell width W, and cell height CH is greater than cell height H. M1 layer of the logic cell includes metal lines electrically connected to a device layer, such as a $V_{DD}$ line 410A, a $V_{SS}$ line 410B, metal line 410C, metal line 410D, metal line 410E, and a metal line 410F. The device layer of the logic cell includes transistors, such as NFETs and PFETs, each of which has a gate disposed between a source and a drain, where M1 layer of the logic cell is electrically connected to at least one gate, at least one source, and/or at least one drain of the transistors. In some embodiments, gates of the transistors of the logic cell extend longitudinally along the same direction as gates in SRAM cell 200 (i.e., the x-direction), and metal lines of M1 layer of the logic cell have a routing direction that is substantially perpendicular to the gate lengthwise direction (i.e., $V_{DD}$ line 410A, $V_{SS}$ line 410B, and metal lines 410C-410F extend longitudinally along the y-direction). Metal lines 410C-410F (also referred to as intracell M1 lines) have a pitch P, which is a minimum (smallest) pitch of metal lines in M1 layer of the logic cell. Metal lines of M1 layer (e.g., $V_{DD}$ line 410A, $V_{SS}$ line 410B, and metal lines 410C-410F) of the logic cell have a thickness T1 along the z-direction. Thickness T1 is greater than pitch P to reduce and minimize resistance of metal lines of M1 layer in the logic cell. In some embodiments, a ratio of thickness T1 to pitch P (i.e., T1:P) is about 1.05 to about 2. A thickness/pitch ratio that is less than about 1.05 may not provide desired metal resistance reduction, while a thickness/pitch ratio that is greater than about 2 may provide metal aspect ratios (i.e., ratios of metal thickness to metal width) that are too large for seamlessly integrating with conventional contact damascene fabrication processes. Metal lines of M1 layer (e.g., bit line 280A, bit line bar 280B, $V_{DD}$ line 280C, word line landing pad 280D, word line landing pad 280E, 1$^{st}$ $V_{SS}$ landing pad 280F, and/or 2$^{nd}$ $V_{SS}$ landing pad) of SRAM cell 200 have a thickness T2 along the z-direction. In some embodiments, thickness T2 is substantially the same as thickness T1 to reduce resistance in M1 layer of SRAM cell 200. In such embodiments, M1 layer of SRAM cell 200 and M1 layer of the logic cell can be fabricated simultaneously, where in some embodiments, any difference between thickness T2 and thickness T1 that may result from loading effects, such as those associated with etching, planarizing, etc., is less than about 10% In some embodiments, thickness T2 is less than a minimum pitch of metal lines in M1 layer of SRAM cell 200. In some embodiments, thickness T2 is greater than a minimum pitch of metal lines in M1 layer of SRAM cell 200. In some embodiments, thickness T2 is substantially the same as a minimum pitch of metal lines in M1 layer of SRAM cell 200. FIG. 9A and FIG. 9B have been simplified for the sake of clarity to better understand the inventive concepts of the present disclosure. Additional features can be added in SRAM cell 200 and/or the logic cell, and some of the features described below can be replaced, modified, or eliminated in other embodiments of SRAM cell 200 and/or the logic cell.

Figure 11A:
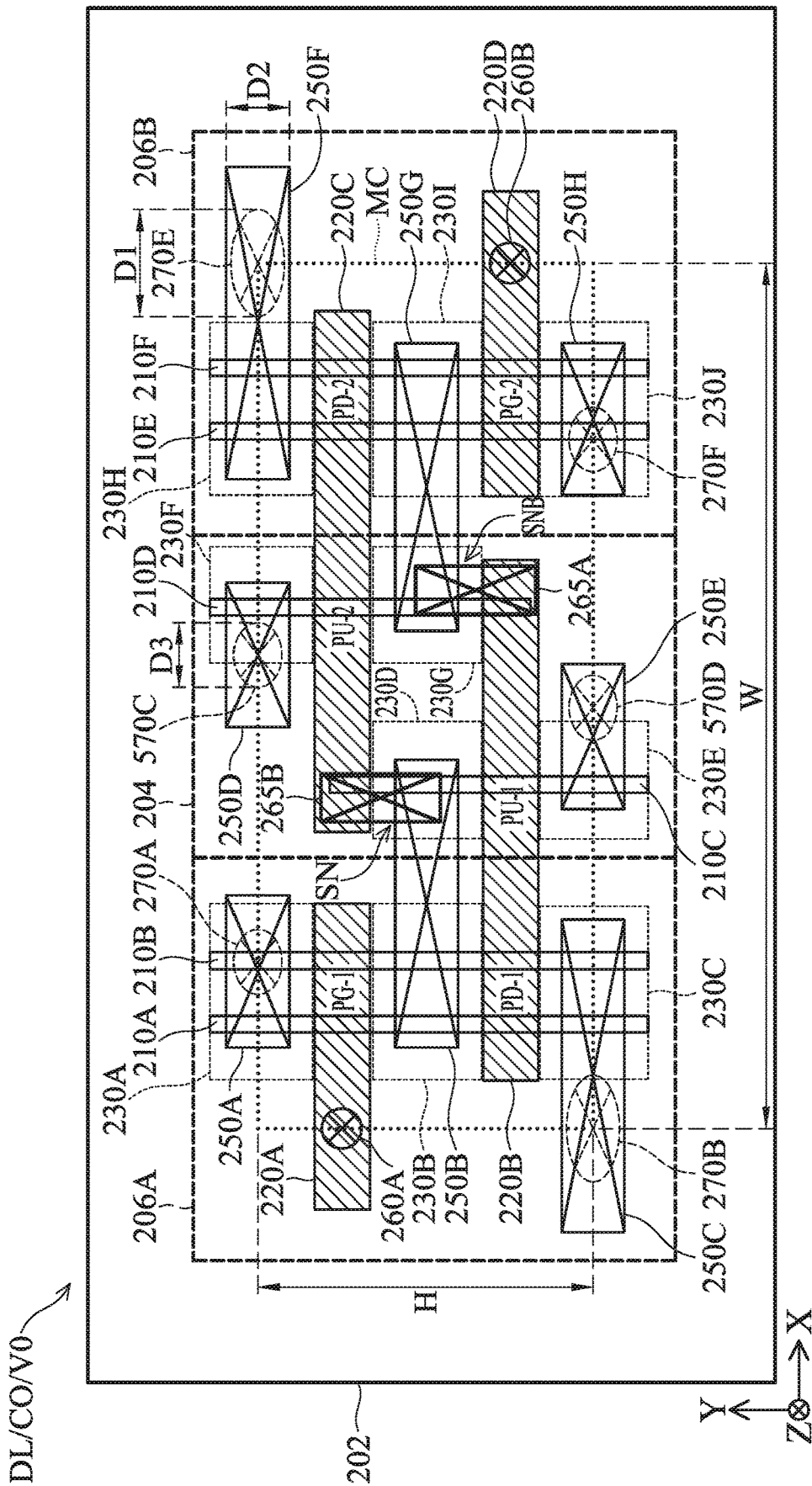
Figure 11B:
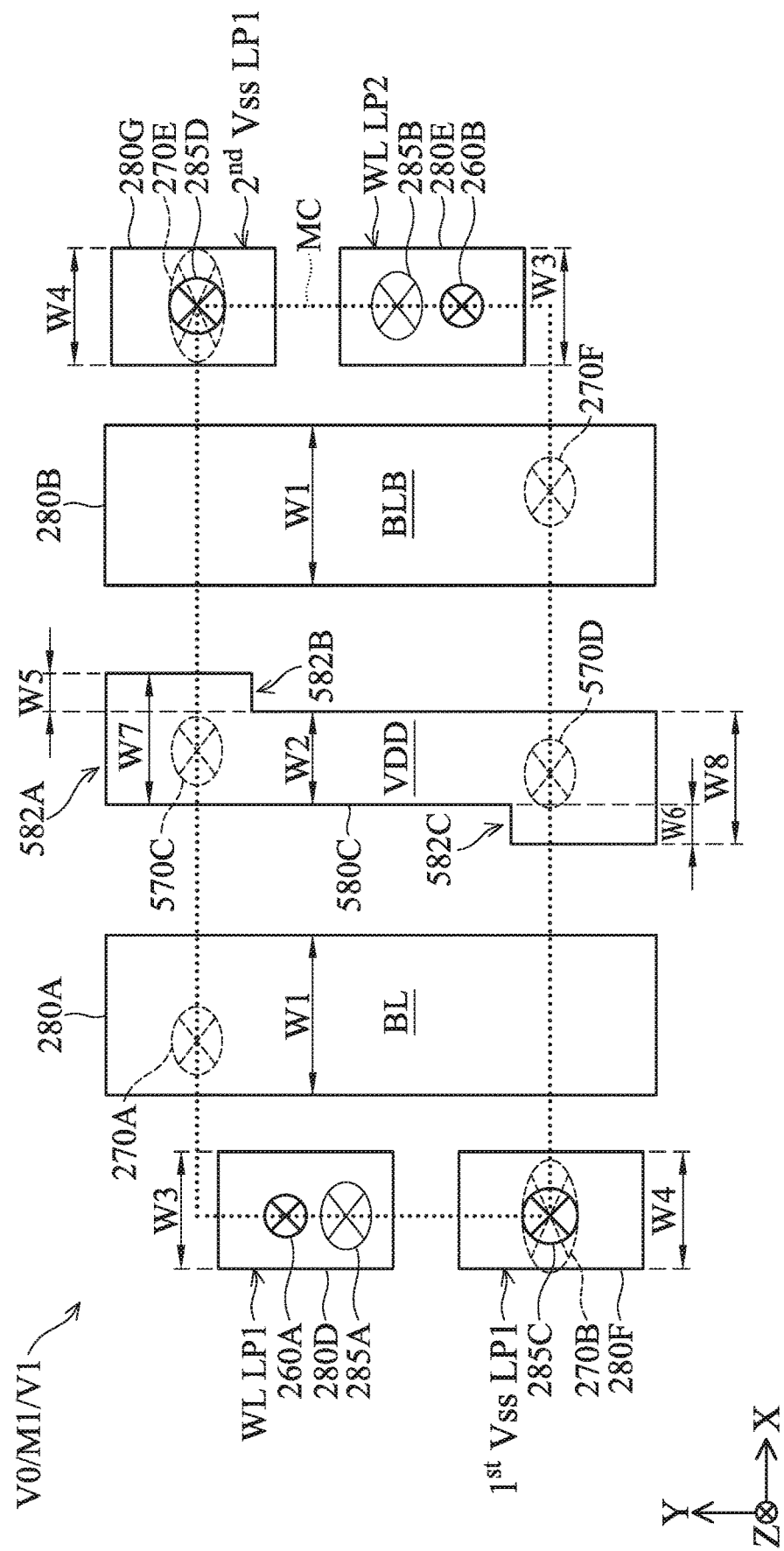
Figure 11C:
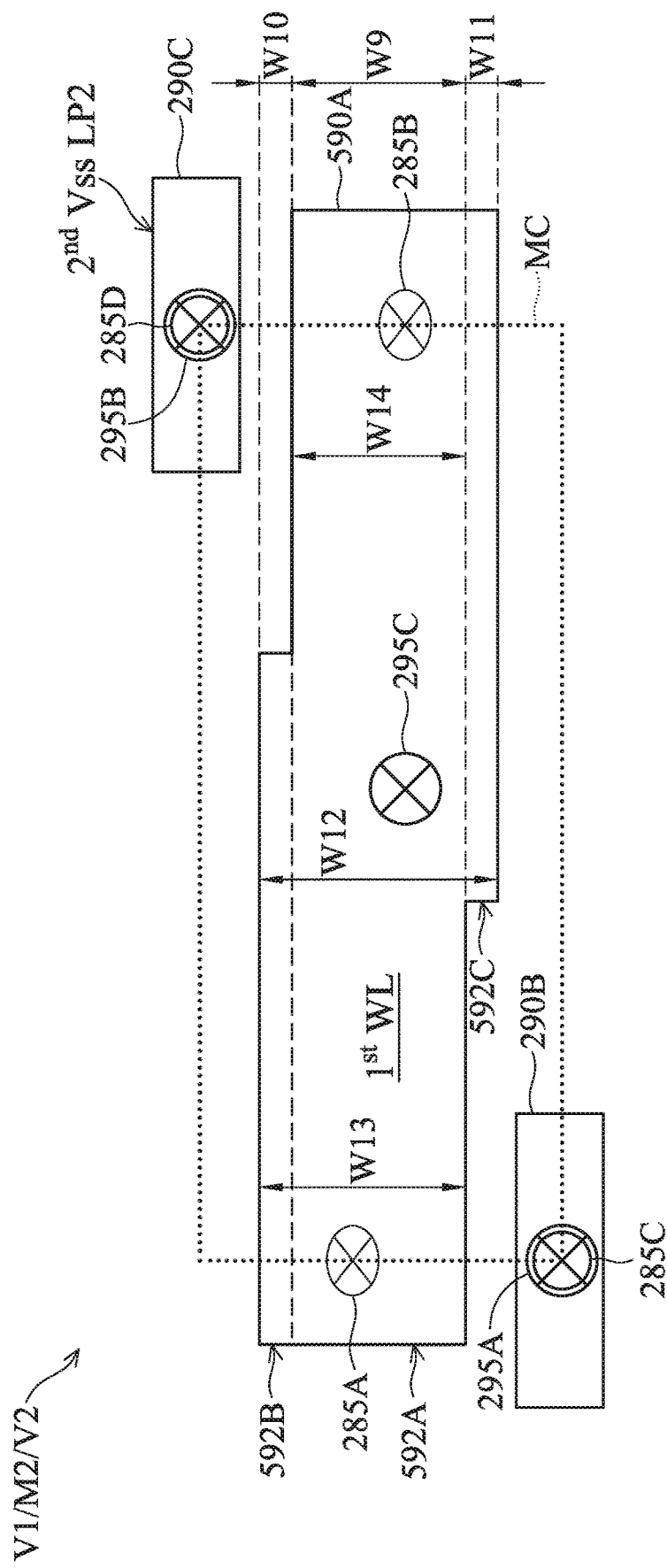
Figure 11D:
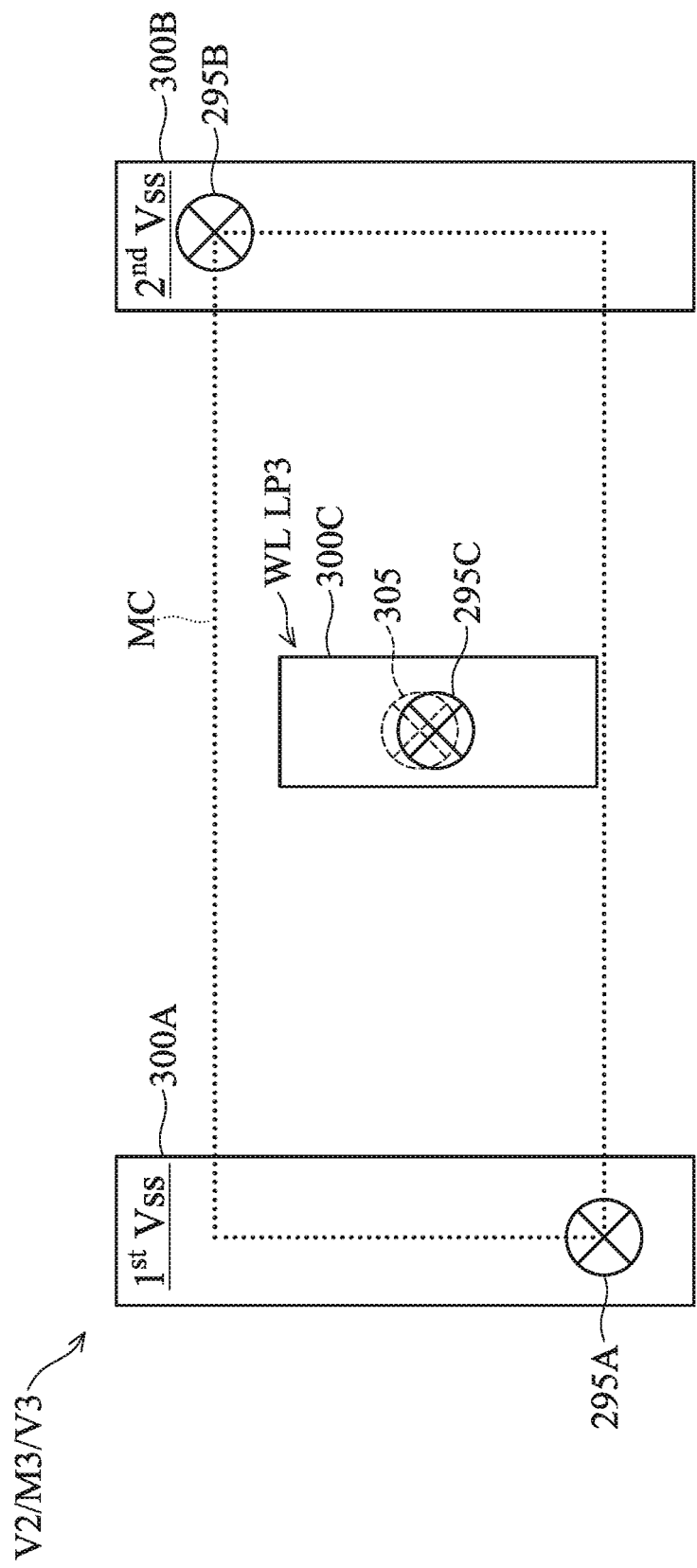
Figure 11E:
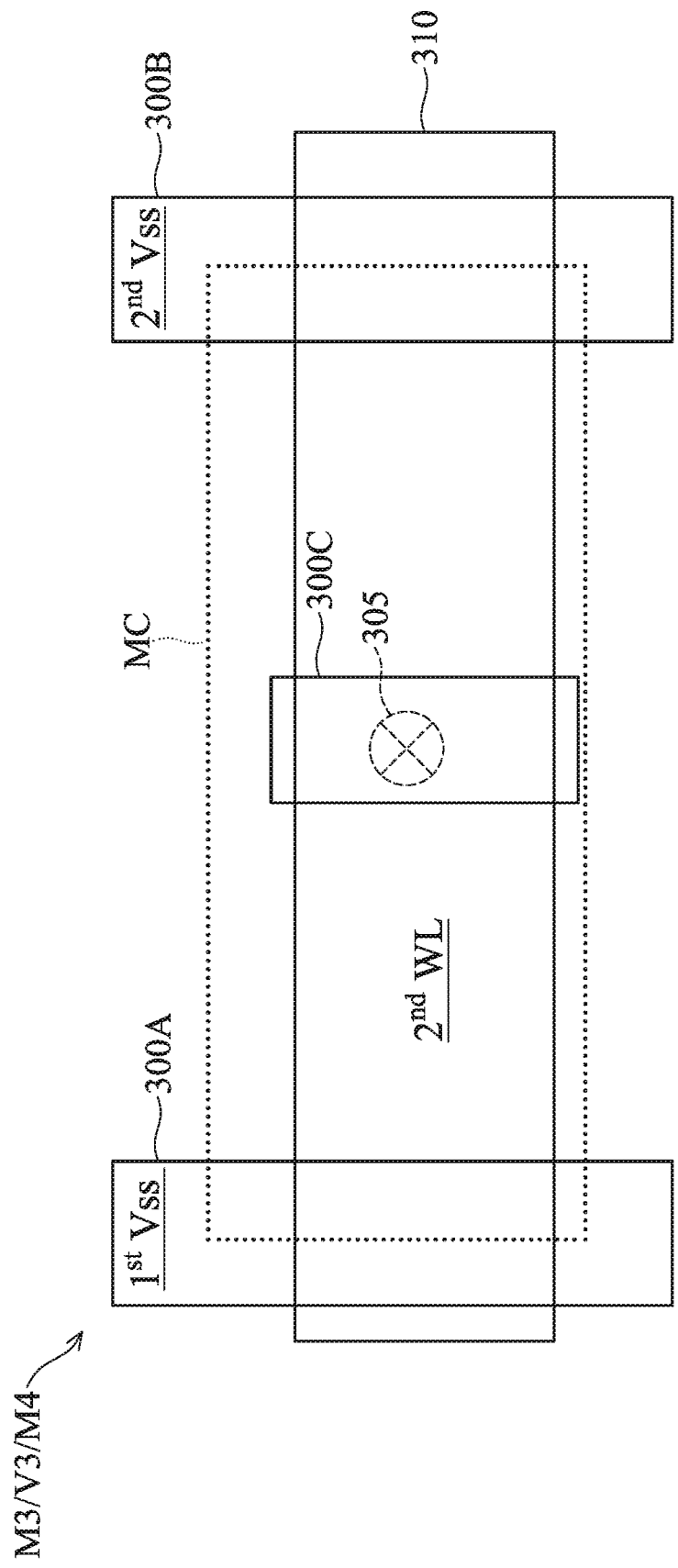

In some embodiments, jogs can be added to a layout of SRAM cell 200 to further optimize SRAM performance by increasing cross-sectional areas of portions of metal lines in M1 layer to M4 layer and thereby reducing resistance of such metal lines. For example, jogs can be added to a $V_{DD}$ line at M1 layer and/or a 1$^{st}$ word line at M2 layer, such that the $V_{DD}$ line and/or the 1$^{st}$ word line have a varying width along its length and exhibit less resistance (because of its greater cross-sectional area) than a $V_{DD}$ line and/or a 1$^{st}$ word line having a substantially uniform width along its length. FIG. 10 is a top, plan view of an SRAM cell 500, in portion or entirety, having a $V_{DD}$ line and a word line with varying width according to various aspects of the present disclosure. FIGS. 11A-11E are various top, plan views of various layers of SRAM cell 500 of FIG. 10 according to various aspects of the present disclosure. For example, FIG. 11A is a top, plan view of a device layer and conductive features in a CO layer and a V0 layer (e.g., DL/CO/V0), in portion or entirety, of SRAM cell 500 according to various aspects of the present disclosure; FIG. 11B is a top, plan view of conductive features in V0 layer, a M1 layer, and a V1 layer (e.g., V0/M1/V1), in portion or entirety, of SRAM cell 500 according to various aspects of the present disclosure; FIG. 11C is a top, plan view of conductive features in V1 layer, a M2 layer, and a V2 layer (e.g., V1/M2/V2), in portion or entirety, of SRAM cell 500 according to various aspects of the present disclosure; FIG. 11D is a top, plan view of conductive features in V2 layer, a M3 layer, and a V3 layer (e.g., V2/M3/V3), in portion or entirety, of SRAM cell 500 according to various aspects of the present disclosure; and FIG. 11E is a top, plan view of conductive features in M3 layer, V3 layer, and a M4 layer (e.g., M3/V3/M4), in portion or entirety, of SRAM cell 500 according to various aspects of the present disclosure. For clarity and simplicity, similar features of SRAM cell 200 in FIG. 5A, FIG. 5B, and FIGS. 6A-6E and SRAM cell 500 in FIG. 10 and FIGS. 11A-11E are identified by the same reference numerals. SRAM cell 500 may be implemented in memory 10 of FIG. 1 and/or memory 400 of FIG. 7. In some embodiments, the features of SRAM cell 500 are configured to provide an SRAM circuit, such as depicted in FIG. 2 and/or FIG. 3. In some embodiments, SRAM cell 500 is configured to have a power mesh, such as depicted and described with reference to FIGS. 8A-8C, and/or have dimensions relative to a logic cell, such as depicted and described with reference to FIG. 9A and FIG. 9B. FIG. 10 and FIGS. 11A-11E have been simplified for the sake of clarity to better understand the inventive concepts of the present disclosure. Additional features can be added in SRAM cell 500, and some of the features described below can be replaced, modified, or eliminated in other embodiments of SRAM cell 500.

In FIG. 10 and FIGS. 11A-11E, SRAM cell 500 includes a $V_{DD}$ line 580C in M1 layer formed by a strip portion 582A having width W2, which corresponds with $V_{DD}$ line 280C as designed in SRAM cell 200, a jog portion 582B having a width W5, which corresponds with a jog added to a $V_{DD}$ line of an SRAM design layout of an SRAM cell (for example, for SRAM cell 200), and a jog portion 582C having a width W6, which corresponds with a jog added to the $V_{DD}$ line of the SRAM design layout of the SRAM cell. In some embodiments, width W5 and width W6 are the same. In some embodiments, width W5 and width W6 are different. The jogs are added to interconnection regions (areas) of the $V_{DD}$ line to increase cross-sectional areas of the interconnection regions, thereby reducing resistance of the $V_{DD}$ line. In the depicted embodiment, jog portion 582B provides $V_{DD}$ line 580C with a width W7 (i.e., a sum of width W2 and width W5) at an interconnection region at an end of $V_{DD}$ line 580C located at the upper edge of cell boundary MC, and jog portion 582C provides $V_{DD}$ line 580C with a width W8 (i.e., a sum of width W2 and width W6) at an interconnection region at an end of $V_{DD}$ line 580C located at the lower edge of cell boundary MC. Width W7 and width W8 are each greater than width W2. In some embodiments, width W7 and width W8 are the same. In some embodiments, width W7 and width W8 are different. In furtherance of the depicted embodiment, width W7 and width W8 are each less than width W1 to ensure that bit line 280A and bit line bar 280B have a greatest width of metal lines of M1 layer. Increasing cross-sectional areas of the interconnection regions of the $V_{DD}$ line allows for increasing cross-sectional areas of the source/drain vias in V0 layer that connect the $V_{DD}$ line to source/drain contacts (and thus to underlying source/drain regions). For example, SRAM cell 500 can include a source/drain via 570C (instead of source/drain via 270C) and a source/drain via 570D (instead of source/drain via 270D) that are substantially rectangular-shaped and/or oval-shaped (i.e., each has a dimension D3 along the x-direction that is different than a dimension D4 along the y-direction) to reduce contact resistance associated with interconnection structures from sources of pull-up transistors PU-1, PU-2 to $V_{DD}$ line 580C. Such source/drain vias can also be referred to as slot-shaped vias. In some embodiments, a ratio of dimension D3 to dimension D4 (i.e., D3:D4) is about 1.1 to about 2. A longest dimension/shortest dimension ratio for source/drain vias corresponding with the $V_{DD}$ line that is less than about 1.1 may not provide desired via resistance reduction, while a longest dimension/shortest dimension ratio for source/drain vias corresponding with the $V_{DD}$ line that is greater than about 2 may be too large and negatively impact widths of adjacent bit lines (for example, by necessitating wider VDD line widths and/or thinner bit line widths to accommodate larger source/drain vias).

SRAM cell 500 further includes a 1$^{st}$ word line 590A in M2 layer formed by a strip portion 592A having a width W9, which corresponds with 1$^{st}$ word line 290A as designed in SRAM cell 200, a jog portion 592B having a width W10, which corresponds with a jog added to a 1$^{st}$ word line of an SRAM design layout of an SRAM cell (for example, for SRAM cell 200), and a jog portion 592C having a width W11, which corresponds with a jog added to the $1^{st}$ word line of the SRAM design layout of the SRAM cell. In some embodiments, width W10 and width W11 are the same. In some embodiments, width W10 and width W11 are different. The jogs are added to interconnection regions of the $1^{st}$ word line to increase cross-sectional areas of the interconnection regions, thereby reducing resistance of the $1^{st}$ word line and reducing word line delay. In the depicted embodiment, jog portion 592B extends from a first end of strip portion 592A along a top portion of the length of strip portion 592A, jog portion 592C extends from a second, opposite end of strip portion 592A along a bottom portion of the length of strip portion 592A, and jog portion 592B and jog portion 592C both extend overlap a central portion of strip portion 592A. Such configuration provides $1^{st}$ word line 590A with a central portion having a width W12 (i.e., a sum of width W9, width W10, and width W11) at a center interconnection region of $1^{st}$ word line 590A located within cell boundary MC, an end portion having a width W13 (i.e., a sum of width W9 and width W10) at an end interconnection region of $1^{st}$ word line 590A located at a left edge of cell boundary MC, and an end portion having a width W14 (i.e., a sum of width W9 and width W11) at an end interconnection region of $1^{st}$ word line 590A located at a right edge of cell boundary MC. Width W13 and width W14 are each less than width W12, such that the central portion of $1^{st}$ word line 590A is wider than end portions (e.g., cell boundary portions) of $1^{st}$ word line 590A. In some embodiments, width W13 and width W14 are the same. In some embodiments, width W13 and width W14 are different. In some embodiments, a ratio of center width (i.e., width W12) to edge width (i.e., width W13 and/or width W14) is about 1.1 to about 2. A center width/edge width ratio that is less than about 1.1 may not provide desired word line resistance reduction (e.g., word line resistance reduction may be negligible), while a center width/edge width ratio that is greater than about 2 may provide word lines with center widths that are too wide to provide sufficient isolation between adjacent metal lines and/or adjacent metal lines in M2 layer (i.e., insufficient metal isolation margins).

Various conductive features of the MLI features, such as contacts, vias, and/or metal lines, described herein can include tungsten, ruthenium, cobalt, copper, aluminum, iridium, palladium, platinum, nickel, other low resistivity metal constituent, alloys thereof, or combinations thereof. In some embodiments, a conductive material of conductive features of V0 layer is different than a conductive material of conductive features of M1 layer. For example, conductive features of M1 layer include copper, while conductive feature of V0 layer include tungsten or ruthenium. In some embodiments, a conductive material of conductive features of V0 layer are the same as a conductive material of conductive features of M1 layer. In some embodiments, various layers of the MLI features, such as CO layer, V0 layer, M1 layer, V1 layer, M2 layer, V2 layer, M3 layer, V3 layer, and/or M4 layer, described herein can be fabricated by depositing a dielectric layer (e.g., an ILD layer and/or a CESL) over a substrate; performing a lithography and etching process to form one or more openings in the dielectric layer that expose one or more conductive features in an underlying layer, filling the one or more openings with a conductive material, and performing a planarization process that removes excess conductive material, such that conductive features and the dielectric layer have substantially planar surfaces. The conductive material is formed by a deposition process (for example, PVD, CVD, ALD, or other suitable deposition process) and/or annealing process. In some embodiments, the conductive features include a bulk layer (also referred to as a conductive plug). In some embodiments, the conductive features include a barrier layer, an adhesion layer, and/or other suitable layer disposed between the bulk layer and dielectric layer. In some embodiments, the barrier layer, the adhesion layer, and/or other suitable layer include titanium, titanium alloy (e.g., TiN), tantalum, tantalum alloy (e.g., TaN), other suitable constituent, or combinations thereof. In some embodiments, a via layer (e.g., V0 layer) and a metallization layer (e.g., M1 layer) of the MLI features can be formed by a single damascene or a dual damascene process.

The present disclosure provides for many different embodiments. Configurations of metal layers of interconnect structures are disclosed herein that can improve memory performance, such as SRAM memory performance, and/or logic performance. For example, embodiments herein place bit lines in M1 layer, which is a lowest metallization level of an interconnect structure of a memory cell, to minimize bit line capacitance, and configure bit lines as the widest metal lines of the metal one layer to minimize bit line resistance. In some embodiments, the interconnect structure has a double word line structure to reduce word line resistance. In some embodiments, the interconnect structure has a double voltage line structure to reduce voltage line resistance. In some embodiments, jogs are added to a word line and/or a voltage line to reduce its respective resistance. In some embodiments, via shapes of the interconnect structure are configured to reduce resistance of the interconnect structure.

An exemplary integrated circuit structure includes a memory cell connected to a bit line, a bit line bar, a first voltage line for receiving a first voltage, a word line, and a second voltage line for receiving a second voltage that is different than the first voltage. The integrated circuit structure further includes an interconnect structure disposed over the memory cell. The interconnect structure includes the bit line, the bit line bar, the first voltage line, the word line, and the second voltage line. The bit line, the bit line bar, the first voltage line, and the second voltage line extend along a first lengthwise direction. The word line extends along a second lengthwise direction that is different than the first lengthwise direction. The interconnect structure has a bottommost metal layer having metal lines connected to the memory cell. The metal lines include the bit line, the first voltage line, a voltage line landing pad connected to the second voltage line, and a word line landing pad connected to the word line. A width of the bit line is a widest width of the metal lines. In some embodiments, the width of the bit line is a first width, the first voltage line has a second width, and a ratio of the first width to the second width is about 1.1 to about 2 (in some embodiments, about 1.1 to about 1.4). In some embodiments, the width of the bit line is a first width, the voltage line landing pad has a second width, and a ratio of the first width to the second width is about 1.1 to about 2 (in some embodiments, about 1.1 to about 1.4). In some embodiments, the width of the bit line is a first width, the word line landing pad has a second width, and a ratio of the first width to the second width is about 1.1 to about 2 (in some embodiments, about 1.1 to about 1.4). In some embodiments, the width of the bit line is a first width, the metal lines further include the bit line bar, the bit line bar has a second width, and the second width is the same as the first width. In some embodiments, the first voltage line has a first portion having a first width and a second portion having a second width that is greater than the first width. The second portion having the second width is an interconnection region of the first voltage line. In some embodiments, the integrated circuit structure further includes a logic cell connected to a third voltage line for receiving a third voltage, where the interconnect structure includes the third voltage line extending along the first lengthwise direction, the metal lines of the bottommost metal layer include the third voltage line, and a first thickness of the bit line is the same as a second thickness of the third voltage line.

In some embodiments, the bottommost metal layer is a first metal layer and the metal lines are first metal lines, and the interconnect structure further has a second metal layer over the first metal layer and a third metal layer over the second metal layer, where the second metal layer has second metal lines that include the word line and the third metal layer has third metal lines that include the second voltage line. In such embodiments, the word line may be a first word line, the word line landing pad may be a first word line landing pad, and the third metal lines of the third metal layer may further include a second word line landing pad connected to the first word line. In such embodiments, the interconnect structure may further have a fourth metal layer over the third metal layer, where the fourth metal layer has fourth metal lines that include a second word line and the second word line is connected to the second word line landing pad. In some embodiments, the memory cell further includes a third voltage line for receiving the second voltage, the interconnect structure has a fourth metal layer over the third metal layer, the fourth metal layer has fourth metal lines that include the third voltage line, and the third voltage line is connected to the second voltage line.

Another exemplary integrated circuit structure includes a memory cell and an interconnect structure disposed over and electrically coupled to the memory cell. The interconnect structure includes a first metal layer electrically coupled to the memory cell, a second metal layer disposed over the first metal layer, a third metal layer disposed over the second metal layer, and a fourth metal layer disposed over the third metal layer. The first metal layer includes a bit line, a first voltage line configured to receive a first voltage, a first voltage line landing pad, and a first word line landing pad. The second metal layer includes a first word line electrically coupled to the first word line landing pad and a second voltage line landing pad electrically coupled to the first voltage line landing pad. The third metal layer includes a second voltage line electrically coupled to the second voltage line landing pad, where the second voltage line is configured to receive a second voltage. The fourth metal layer includes a second word line. The bit line, the first voltage line, and the second voltage line extend along a first lengthwise direction, the first word line and the second word line extend along a second lengthwise direction that is different than the first lengthwise direction, and a first width of the bit line is greater than a second width of the first voltage line. In some embodiments, the first width of the bit line is greater than a third width of the first voltage line landing pad and a fourth width of the first word line landing pad. In some embodiments, the first metal layer further includes a bit line bar that extends along the first lengthwise direction, wherein a third width of the bit line bar is greater than the second width of the first voltage line. In some embodiments, the third width of the bit line bar is the same as the first width of the bit line. In some embodiments, the second word line is electrically coupled to the first word line. In some embodiments, the integrated circuit structure further includes an edge cell, wherein the second word line is electrically coupled to the first word line by a first connection in the memory cell and a second connection in the edge cell. In some embodiments, the fourth metal layer further includes a third voltage line configured to receive the second voltage. In some embodiments, the third voltage line is electrically coupled to the second voltage line.

An exemplary method for forming a multilayer interconnect structure of a memory includes forming a first metallization layer that includes a bit line, a bit line bar, and a first voltage line configured to receive a first voltage. The bit line, the bit line bar, and the first voltage line extend along a first routing direction, the first metallization layer is a bottommost metallization layer of the multilayer interconnect structure, and a bit line width of the bit line has a widest width of metal lines of the first metallization layer. The method further includes forming a second metallization layer over the first metallization layer. The second metallization layer includes a first word line that extends along a second routing direction that is different than the first routing direction. The method further includes forming a third metallization layer over the second metallization layer. The third metallization layer includes a second voltage line and a third voltage line configured to receive a second voltage that is different than the first voltage and the second voltage line and the third voltage line extend along the first routing direction. The method further includes forming a fourth metal layer disposed over the third metal layer. The fourth metal layer includes a second word line that extends along the second routing direction. In some embodiments, a ratio of the bit line width to a width of any one of the metal lines of the first metallization layer is about 1.1 to about 2 (in some embodiments, about 1.4).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
a memory cell connected to a bit line, a bit line bar, a first voltage line for receiving a first voltage, a word line, and a second voltage line for receiving a second voltage that is different than the first voltage; and
an interconnect structure disposed over the memory cell, wherein:
the interconnect structure includes the bit line, the bit line bar, the first voltage line, the word line, and the second voltage line, wherein the bit line, the bit line bar, the first voltage line, and the second voltage line extend along a first lengthwise direction, and the word line extends along a second lengthwise direction that is different than the first lengthwise direction,
the interconnect structure has a bottommost metal layer having metal lines connected to the memory cell, wherein the metal lines include the bit line, the first voltage line, a voltage line landing pad connected to the second voltage line, and a word line landing pad connected to the word line, and wherein a width of the bit line is a widest width of the metal lines.

2. The integrated circuit structure of claim 1, wherein the width of the bit line is a first width, the first voltage line has a second width, and a ratio of the first width to the second width is about 1.1 to about 2.

3. The integrated circuit structure of claim 1, wherein the width of the bit line is a first width, the voltage line landing pad has a second width, and a ratio of the first width to the second width is about 1.1 to about 2.

4. The integrated circuit structure of claim 1, wherein the width of the bit line is a first width, the word line landing pad has a second width, and a ratio of the first width to the second width is about 1.1 to about 2.

5. The integrated circuit structure of claim 1, wherein the width of the bit line is a first width, the metal lines further include the bit line bar, the bit line bar has a second width, and the second width is the same as the first width.

6. The integrated circuit structure of claim 1, wherein the first voltage line has a first portion having a first width and a second portion having a second width that is greater than the first width, wherein the second portion having the second width is an interconnection region of the first voltage line.

7. The integrated circuit structure of claim 1, wherein:
the bottommost metal layer is a first metal layer and the metal lines are first metal lines;
the interconnect structure has a second metal layer over the first metal layer and a third metal layer over the second metal layer; and
wherein the second metal layer has second metal lines that include the word line and the third metal layer has third metal lines that include the second voltage line.

8. The integrated circuit structure of claim 7, wherein the word line is a first word line, the word line landing pad is a first word line landing pad, the third metal lines of the third metal layer include a second word line landing pad connected to the first word line, the interconnect structure has a fourth metal layer over the third metal layer, and the fourth metal layer has fourth metal lines that include a second word line, wherein the second word line is connected to the second word line landing pad.

9. The integrated circuit structure of claim 7, wherein the memory cell further includes a third voltage line for receiving the second voltage, the interconnect structure has a fourth metal layer over the third metal layer, the fourth metal layer has fourth metal lines that include the third voltage line, and the third voltage line is connected to the second voltage line.

10. The integrated circuit structure of claim 1, further comprising:
a logic cell connected to a third voltage line for receiving a third voltage; and
wherein the interconnect structure includes the third voltage line extending along the first lengthwise direction, the metal lines of the bottommost metal layer include the third voltage line, and a first thickness of the bit line is the same as a second thickness of the third voltage line.

11. An integrated circuit structure comprising:
a memory cell; and
an interconnect structure disposed over and electrically coupled to the memory cell, wherein the interconnect structure includes:
a first metal layer electrically coupled to the memory cell, wherein the first metal layer includes a bit line,
a first voltage line configured to receive a first voltage, a first voltage line landing pad, and a first word line landing pad,
a second metal layer disposed over the first metal layer, wherein the second metal layer includes a first word line electrically coupled to the first word line landing pad and a second voltage line landing pad electrically coupled to the first voltage line landing pad,
a third metal layer disposed over the second metal layer, wherein the third metal layer includes a second voltage line electrically coupled to the second voltage line landing pad, wherein the second voltage line is configured to receive a second voltage,
a fourth metal layer disposed over the third metal layer, wherein the fourth metal layer includes a second word line, and
wherein the bit line, the first voltage line, and the second voltage line extend along a first lengthwise direction, the first word line and the second word line extend along a second lengthwise direction that is different than the first lengthwise direction, and a first width of the bit line is greater than a second width of the first voltage line.

12. The integrated circuit structure of claim 11, wherein the first width of the bit line is greater than a third width of the first voltage line landing pad and a fourth width of the first word line landing pad.

13. The integrated circuit structure of claim 11, wherein the first metal layer further includes a bit line bar that extends along the first lengthwise direction, wherein a third width of the bit line bar is greater than the second width of the first voltage line.

14. The integrated circuit structure of claim 13, wherein the third width of the bit line bar is the same as the first width of the bit line.

15. The integrated circuit structure of claim 11, wherein the second word line is electrically coupled to the first word line.

16. The integrated circuit structure of claim 15, further comprising an edge cell, wherein the second word line is electrically coupled to the first word line by a first connection in the memory cell and a second connection in the edge cell.

17. The integrated circuit structure of claim 11, wherein the fourth metal layer further includes a third voltage line configured to receive the second voltage.

18. The integrated circuit structure of claim 17, wherein the third voltage line is electrically coupled to the second voltage line.

19. A method for forming a multilayer interconnect structure of a memory, the method comprising:
forming a first metallization layer that includes a bit line, a bit line bar, and a first voltage line configured to receive a first voltage, wherein the bit line, the bit line bar, and the first voltage line extend along a first routing direction, the first metallization layer is a bottommost metallization layer of the multilayer interconnect structure, and a bit line width of the bit line has a widest width of metal lines of the first metallization layer;
forming a second metallization layer over the first metallization layer, wherein the second metallization layer includes a first word line that extends along a second routing direction that is different than the first routing direction;
forming a third metallization layer over the second metallization layer, wherein the third metallization layer includes a second voltage line and a third voltage line configured to receive a second voltage that is different than the first voltage and the second voltage line and the third voltage line extend along the first routing direction; and forming a fourth metal layer disposed over the third metal layer, wherein the fourth metal layer includes a second word line that extends along the second routing direction.

20. The method for forming the multilayer interconnect structure of the memory of claim 19, wherein a ratio of the bit line width to a width of any one of the metal lines of the first metallization layer is about 1.1 to about 2.

* * * * *